(12) United States Patent
Shibata et al.

(10) Patent No.: US 8,531,244 B2
(45) Date of Patent: Sep. 10, 2013

(54) HIGH FREQUENCY SIGNAL PROCESSING DEVICE

(75) Inventors: Kenichi Shibata, Kanagawa (JP); Toshiya Uozumi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/165,879

(22) Filed: Jun. 22, 2011

(65) Prior Publication Data
US 2012/0019328 A1  Jan. 26, 2012

(30) Foreign Application Priority Data

Jul. 20, 2010  (JP) ................................. 2010-162445

(51) Int. Cl.
*H03L 7/085* (2006.01)
*H03L 7/087* (2006.01)
(52) U.S. Cl.
USPC ................... 331/11; 331/16; 331/23; 331/34; 327/156; 332/127; 375/376
(58) Field of Classification Search
USPC ................ 327/147, 156; 331/11, 16, 17, 23, 331/34; 332/127; 375/373, 375, 376
See application file for complete search history.

(56) References Cited

U.S. PATENT DOCUMENTS

| | | | | |
|---|---|---|---|---|
| 5,834,987 A * | 11/1998 | Dent | ............................ | 332/127 |
| 6,674,331 B2 * | 1/2004 | McDowell | ...................... | 331/16 |
| 6,993,314 B2 * | 1/2006 | Lim et al. | ....................... | 455/333 |
| 7,002,416 B2 * | 2/2006 | Pettersen et al. | ................. | 331/16 |
| 7,696,830 B2 * | 4/2010 | Ohara et al. | ..................... | 331/17 |
| 7,898,343 B1 * | 3/2011 | Janesch | ............................ | 331/16 |
| 8,179,174 B2 * | 5/2012 | Bunch | ........................... | 327/156 |
| 2006/0197605 A1 * | 9/2006 | Hirano et al. | ................... | 331/16 |
| 2007/0057736 A1 * | 3/2007 | Baird et al. | ..................... | 331/16 |

OTHER PUBLICATIONS

R. Yu et al., A 5.5mA 2.4-GHz Two-Point Modulation Zigbee Transmitter with Modulation Gain Calibration, !EEE 2009 Custom Intergrated Circuits Conference (CICC), Sep. 2009, pp. 375-378.

* cited by examiner

*Primary Examiner* — Levi Gannon
(74) *Attorney, Agent, or Firm* — Mattingly & Malur, PC

(57) ABSTRACT

A high frequency signal processing device is capable of carrying out high-accuracy modulation by a PLL circuit. A digital loop is configured in addition to an analog loop having, for example, a phase frequency detector, a charge pump circuit, and a loop filter. A digital calibration circuit is provided which searches for the optimal code set to a capacitor bank upon frequency modulation. Upon the search for the optimal code, a calibration controller first sets a division ratio based on a center frequency to a divider and determines the value of a voltage control signal using the analog loop. Then, the loop filter holds the value of the voltage control signal therein, and a division ratio corresponding to a "center frequency+modulated portion" is set to the divider, thereby operating the digital loop. The optimal code is obtained by a convergent value of the digital loop.

16 Claims, 26 Drawing Sheets

|  | TARGET VALUE | DESIGN RESULT | DETERMINATION |
|---|---|---|---|
| ACCURACY [ppm] | ≤10 | 5 | ○ |
| TIME [μs] | ≤71 | 66 | ○ |
| AREA [mm²] (ESTIMATED VALUE) | <0.05 | 0.04 | ○ |

SET VALUE (NI) OF DIVIDER DIV
(INPUT VALUE OF CALIBRATION)

VALUE OF CODE SIGNAL (CODE)
(OUTPUT VALUE OF CALIBRATION)

FIG. 10(a)

| DESIGN ITEM | DESIGN VALUE |
|---|---|
| $A_{DPFD}$ (PHASE COMPARISON GAIN) | 20 |
| $K_{MOD}$ (MODULATION SENSITIVITY) | 9.7 kHz / CODE |
| N (DIVISION RATIO) | 152.5 |
| $T_{ref}$ (REFERENCE CLOCK CYCLE) | 62.5 ns (16 MHz) |
| $A_{DG}$ (MULTIPLICATION CIRCUIT GAIN) | 64 |

| CONDITION | VALUE |
|---|---|
| tol (CONVERGENCE FREQUENCY ALLOWABLE ERROR) | 10 kHz |
| $f_1$ (INITIAL FREQUENCY) | 0 |
| $f_2$ (POST-SWITCHED FREQUENCY) | 500 kHz |

FIG. 10(b)

| CONDITION | VALUE |
|---|---|
| $f_c$ (LOOP BAND) | 90 kHz |
| $\theta_{PM}$ (PHASE MARGIN) | 66.2° |
| $T_{LOCK}$ (SETTLING TIME) | 16.6 μs |

FIG. 14

| SEQUENCE NAME/MODE | | MODE: 0 | MODE: 1 | MODE: 2 | MODE: 3 |
|---|---|---|---|---|---|
| VCO Cal | ABS | 35 | 35 | 35 | 35 |
| Mid Cal | PLL_L | 10 | skip | skip | skip |
| | CAL_W | 20 | skip | skip | skip |
| | CAL_A | 8 | skip | skip | skip |
| High Cal | PLL_L | 10 | 10 | 10 | 10 |
| | CAL_W | 20 | 20 | 20 | 20 |
| | CAL_A | 8 | 8 | 8 | 8 |
| Low Cal | PLL_L | 10 | 10 | skip | skip |
| | CAL_W | 20 | 20 | 20 | skip |
| | CAL_A | 8 | 8 | 8 | skip |
| TX ADVANCE PREPARATION | PLL_L | 10 | 10 | 10 | 10 |
| | PAON | 14 | 14 | 14 | 14 |
| | ~TXDATA | 14 | 14 | 14 | 14 |
| SUM | | 187 | 149 | 139 | 111 |
| PURE Cal TIME | | 114 | 76 | 66 | 38 |
| Warm-up TIME DECISION (≤71 μs) | | NG | NG | OK | OK |

PURE Cal TIME

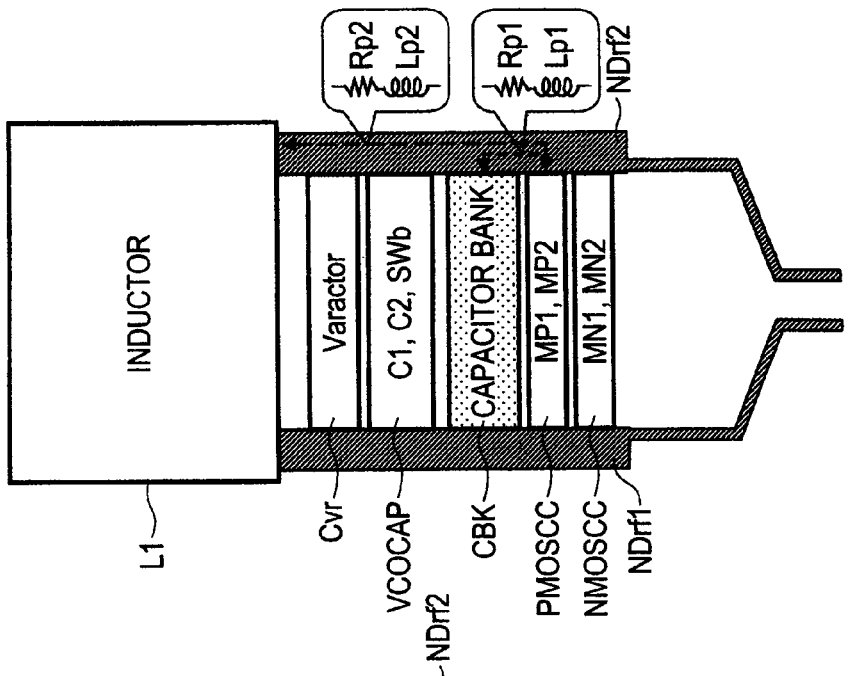
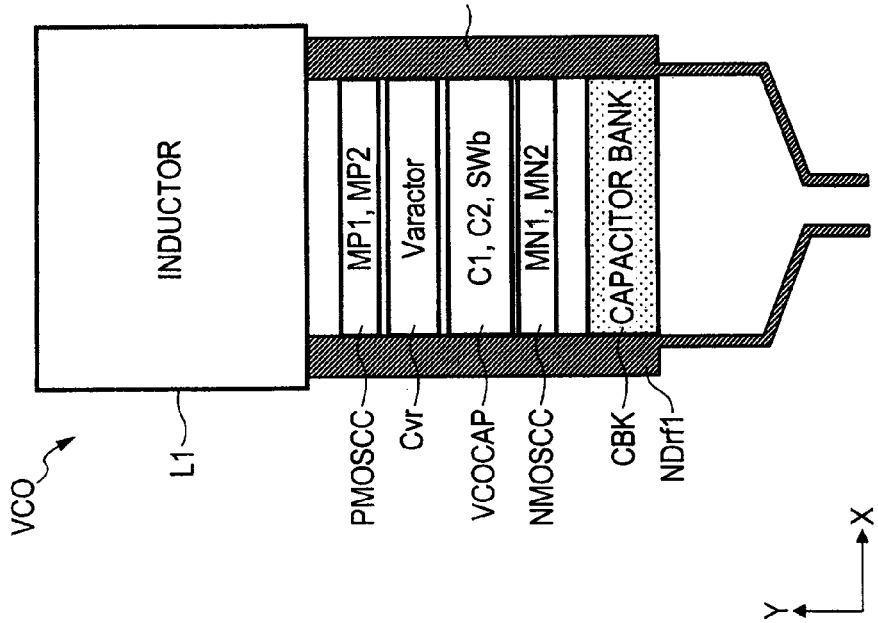

HIGH FREQUENCY SIGNAL PROCESSING DEVICE

CROSS-REFERENCE TO RELATED APPLICATIONS

The disclosure of Japanese Patent Application No. 2010-162445 filed on Jul. 20, 2010 including the specification, drawings and abstract is incorporated herein by reference in its entirety.

BACKGROUND

The present invention relates to a high frequency signal processing device, and in particular to a technology effective if applied to a high frequency signal processing device that performs direct modulation using a PLL (Phase Locked Loop) circuit.

A configuration in which a calibration circuit is provided in a PLL circuit equipped with a two-point modulation system has been shown in, for example, a non-patent document 1. Described concretely, the calibration circuit is comprised of a phase frequency detector (PFD), a charge pump circuit (CP), a comparator circuit, a digital-analog converter (DAC), and a voltage controlled oscillator (VCO). In order to obtain the optimal code of the digital-analog converter (DAC) used at the modulation, the calibration circuit compares an oscillation frequency of the voltage controlled oscillator VCO with a reference frequency and searches for the optimal code while comparing an integral value at the capacity of a charge pump current at that time with a reference voltage.

[Non-Patent Document 1]
Rui Yu et al, WIPRO Techno Center, Singapore (WTCS), "A 5.5 mA 2.4-GHz Two-Point Modulation Zigbee Transmitter with Modulation Gain Calibration, "IEEE CICC, September 2009, pp. 375-378.

SUMMARY

As an alternative to the infrared remote controller, a radio frequency (RF) remote controller based on the ZigBee (Registered Trademark) RF4CE capable of "out-of-sight operation" and "interactive communication" has been expected in recent years. Since the RF remote controller is driven by a battery, it needs to reduce power consumption in addition to stabilization of communications and a cost reduction. Since the power is used up or consumed by a radio frequency IC (high frequency signal processing device) that bears transmission/reception of radio waves in particular, it is desirable to set current consumption thereof to 20 mA or less or the like with respect to both transmission and reception.

FIGS. 22(a) and 22(b) are schematic diagrams showing different configuration examples illustrative of a transmission system circuit in a high frequency signal processing device discussed as a premise of the present invention. A modulation system called "OQPSK with half-sine pulse shaping" configured by combining OQPSK (offset quadrature phase shift keying) with a half-sine pulse shaping filter is used in, for example, ZigBee (Registered Trademark). The OQPSK modulation can be achieved using a transmission system circuit of a so-called IQ quadrature modulation system as shown in FIG. 22(a), for example. The transmission system circuit shown in FIG. 22(a) is comprised of a baseband processing circuit BB, two digital-analog converters DAC, two low-pass filters LPF, two mixers MIX, a PLL circuit (PLL), an oscillator circuit VCO, a division/quadrature conversion circuit (DIV&0/90 deg), a power amplifier PA, etc.

However, when the IQ quadrature modulation system is used, relatively many circuits are required as is understood from FIG. 22(a). There is therefore a possibility that it will not be able to sufficiently achieve a reduction in power consumption and a reduction in circuit area (reduction in cost). Thus, the use of such a PLL direct modulation system as shown in FIG. 22(b) becomes useful. The transmission system circuit of FIG. 22(b) is comprised of a baseband processing circuit BB, a PLL circuit (PLL), an oscillator circuit VCO, and a power amplifier PA. As compared with FIG. 22(a), a reduction in circuit area (cost reduction) can be achieved and a reduction in power consumption can be achieved with the reduction in the circuit area. When the oscillator circuit VCO is controlled in a transmission block of FIG. 22(b) in such a manner that FSK (frequency shift keying) (called MSK (Minimum Shift Keying)) modulation in which a modulation index is 0.5, is performed, the above-described "OQPSK with half-sine pulse shaping" can be achieved equivalently.

A direct sequence spread spectrum (DSSS) is used in the ZigBee (Registered Trademark), and a chip plate of 2 Mcps is required correspondingly. The use of such a configuration example as shown in FIG. 23, for example thus becomes useful as the transmission system circuit of FIG. 22(b). FIG. 23 shows the details of FIG. 22(b), in which FIG. 23(a) is a circuit block diagram showing the configuration example thereof, FIG. 23(b) is a diagram showing one example of an output waveform of a voltage controlled oscillator in FIG. 23(a), and FIG. 23(c) is a diagram showing one example of an output spectrum of the voltage controlled oscillator in FIG. 23(a). In FIG. 23(a), the PLL circuit (PLL) includes a crystal oscillator XTAL, a phase frequency detector PFD, a charge pump circuit CP, a loop filter LF, an oscillator circuit VCO, a divider DIV, a delta-sigma modulator DSM, and a delayer DLY.

An oscillation signal of the oscillator circuit VCO is divided by the divider DIV. The phase frequency detector PFD compares the phase of an output signal of the DIV and the phase of an oscillation signal from the crystal oscillator XTAL and controls the charge pump circuit CP depending on the result of comparison by the phase frequency detector PFD. The charge pump circuit CP generates a discharging current or a charging current corresponding to this control. The corresponding current is averaged by the loop filter LF and converted into a voltage control signal. The oscillation frequency of the oscillator circuit VCO is controlled depending on the magnitude of the voltage control signal. Here, the divider DIV makes use of a system called fractional N and is capable of setting a division ratio (1/X) (where X includes a decimal point) including a decimal point under time series control by the delta-sigma modulator DSM. Consequently, the oscillation frequency of the oscillator circuit VCO becomes "oscillation frequency of XTAL×X" and hence the corresponding oscillation signal is outputted via the power amplifier PA.

In the configuration example of FIG. 23(a), such a PLL is provided with a modulation pass (PLL modulation pass) P1 which is performed on the divider DIV, and a modulation pass (VCO modulation pass) which is performed on the oscillator circuit VCO. That is, a two-point modulation system is used. During the PLL modulation pass, the division ratio of the divider DIV is switched as appropriate to apply modulation to the oscillation frequency of the oscillator circuit VCO. During the VCO modulation pass, the resonant frequency of the oscillator circuit VCO (e.g., LC resonant oscillator circuit) is switched appropriately to apply modulation to the oscillation frequency of the oscillator circuit VCO. Switching of the division ratio of the divider DIV is performed based on channel data CHDAT and transmission data TXDAT on the baseband processing circuit BB. Concretely, the division ratio corresponding to a center frequency (fc) of the oscillator circuit VCO is determined based on the channel data CHDAT. With the division ratio as the center, an increase or decrease in division ratio corresponding to a frequency modulation portion (±Δf) is performed based on the transmission data TXDAT. On the other hand, the switching of the resonant frequency of the oscillator circuit VCO is performed by increasing or decreasing a resonance parameter at the oscillator circuit VCO by the frequency modulation portion (±Δf), based on the transmission data TXDAT. Incidentally, the delayer DLY on the VCO modulation pass is provided to make matching with a clock delay due to a flip-flop on the PLL modulation pass (DSM).

Using such a twp-point modulation system makes it possible to sufficiently ensure a band required at the chip rate of 2 Mcps referred to above. That is, if only the PLL modulation pass P1 is taken, the corresponding pass becomes a low-pass filter characteristic, and the band (PLL's loop band) is normally limited to a few hundred of kHz or so in terms of out-of-band nose and spurious. For this reason, high-pass transmission data will lack. On the other hand, since the VCO modulation pass becomes a high-pass filter characteristic in the case of only the VCO modulation pass, a low-pass frequency component is not sufficiently obtained. Further, since PLL's loop out-of-band control is done, a state close to open loop control is obtained, thus causing a possibility that modulation accuracy will be degraded. Thus, if the two-point modulation system is used, the low-pass filter characteristic and the high-pass filter characteristic are rendered complementary to each other, thereby making it possible to achieve wide-band communications.

Described concretely, the two-point modulation system can be represented with such a transfer function model as shown in FIG. 24(a). When the corresponding model is used, the transfer function $T_{HPF}$ of the VCO modulation pass P2 is expressed in the following equation (1), the transfer function $T_{LPF}$ of the PL modulation pass P1 is expressed in the following equation (2), and the total transfer function $T_{ALL}=T_{HPF}+T_{LPF}$ is expressed in the following equation (3). When modulation sensitivity $G_{m1}$ at P1 and modulation sensitivity $G_{m2}$ at P2 are $G_{m1}=G_{m2}$ (i.e., the same modulation portion (±Δf) is added at P1 and P2) in the following equation (3), the total transfer function becomes $T_{ALL}=1$. A band limitation by the modulation circuit becomes theoretically unnecessary as shown even in FIG. 24(b).

$$T_{HPF}(s) = \frac{\phi_{out}}{\phi_{in,HPF}} = \frac{sG_{m2}}{s + \frac{K_d F(s) K_{VCO}}{N}} \quad (1)$$

$$T_{LPF}(s) = \frac{\phi_{out}}{\phi_{in,LPF}} = \frac{\frac{K_d F(s) K_{VCO} G_{m1}}{N}}{s + \frac{K_d F(s) K_{VCO}}{N}} \quad (2)$$

$$T_{ALL}(s) = \frac{\phi_{out}}{\phi_{in}} = \frac{sG_{m2} + \frac{K_d F(s) k_{VCO} G_{m1}}{N}}{s + \frac{K_d F(s) K_{VCO}}{N}} \quad (3)$$

Thus, when the configuration example of FIG. 23(a) is used, as shown in FIG. 23(b), the frequency modulation (phase modulation) of ±Δf (=±500 kHz) that assumes a relatively wide band with the channel frequency fc as the center can be achieved. As a result, such an output spectrum as shown in FIG. 23(c) is obtained. A spectrum located in the vicinity of fc results from the PLL modulation pass P1, and each spectrum at a frequency away from fc results from the VCO modulation pass P2. Incidentally, ±500 kHz are values where the modulation index of 0.5 is applied to the chip rate of 2 Mcps as described above.

When the transmission system circuit of such a two-point modulation system as shown in FIG. 23(a) is used, $G_{m1}=G_{m2}$ is required in the equation (3) as mentioned above. Since the accuracy of the modulation sensitivity $G_{m1}$ at the PLL modulation pass P1 can be defined by substantially the accuracy of the crystal oscillator XTAL, the modulation sensitivity $G_{m1}$ can be ensured with high accuracy. On the other hand, since the accuracy of the modulation sensitivity $G_{m2}$ at the VCO modulation pass P2 can vary depending on process variations in VCO, variations in temperature and the like, the modulation sensitivity $G_{m2}$ needs calibration. That is, it is necessary to perform calibration in such a manner that the modulation sensitivity $K_{MOD}$ of VCO becomes $K_{MOD}$=500 kHz/code more accurately according to the input code (that means a modulation indication command) in FIG. 23(a).

As items required for the calibration, there are principally mentioned (1) an improvement in accuracy, (2) speeding-up, (3) a reduction in area, and the like. A description will first be made of (1) the improvement in accuracy. FIGS. 25(a) and 25(b) show a result obtained by discussing an accuracy aspect as targeted for the transmission system circuit of FIG. 23(a), in which FIG. 25(a) is a typical diagram showing a simulation model thereof, and FIG. 25(b) is a diagram showing a simulation result. In the simulation, as shown in FIG. 25(a), the PLL modulation pass P1 in FIG. 23(a) is expressed in a low-pass filter model, and the VCO modulation pass P2 is expressed in a high-pass filter model. An EVM (Error Vector Magnitude) is calculated from a result in which transmission data are combined through respective filters. At this time, a variation in the modulation sensitivity $K_{MOD}$ of VCO at P2 appears as a variation in gain at the high-pass filter. Therefore, the allowable amount of variation in $K_{MOD}$ can be verified by calculating EVM while altering the amount of variation in $K_{MOD}$.

As a result, assumes that $K_{MOD}$=1 as shown in FIG. 25(b). EVM is degraded as $K_{MOD}$ varies back and forth therefrom. When the value of EVM required actually is set 15% or less, the allowable amount of variation in $K_{MOD}$ ranges from −5% to +6%. Thus, when $K_{MOD}$=500 kHz/code, it is necessary to suppress the amount of its variation to within about 25 kHz (=500 kHz×5%). When the channel frequency (center frequency) fc in FIG. 23 is set to a 2.4 GHz band, based on the standard of ZigBee (Registered Trademark), 25 kHz becomes about 10 ppm. It is therefore necessary to suppress the accuracy of the oscillation frequency of VCO to within this value.

A description will next be made of (2) the speeding-up. FIG. 26 is a state transition diagram showing one example of an operation mode used in a Zigbee (registered trademark) system. As shown in FIG. 26, the period during which calibration can be carried out, corresponds to a wake-up period transitioned from an RF off state to an idle state (IDLE), and a warm-up period transitioned from the idle state (IDLE) to a transmission state (TX) or a reception state (RX). The wake-up period is 500 μs and the warm-up period is 144 μs. It is necessary to perform calibration and start-up of various analog circuits within either of these periods. It is desirable that calibration is performed within the warm-up period to correct the effect of variations with time such as variations in temperature in particular. It is thus desirable to suppress the calibration time to within, for example, 71 μs by subtracting the time required to start up the various analog circuits from the warm-up period.

A description will be subsequently made of (3) the reduction in the area. The calibration circuit may of course desirably be a small area in terms of a reduction in cost or the like. A configuration capable of reduction in area with miniaturization becomes useful in particular. An RF remote controller is operated by a button battery, for example, and used in a state in which a power supply voltage drops to 2V or so during a period at its majority. Therefore, each circuit needs a low power supply voltage operation at 1.45V or so. For this reason, the calibration circuit may desirably have a configuration that takes advantage of a merit of miniaturization as typified by, for example, a digital circuit.

FIGS. 27(a) and 27(b) show one example of a calibration system relative to the transmission system circuit shown in FIG. 23(a), in which FIG. 27(a) is a conceptual diagram showing its configuration example and operation example, and FIG. 27(b) is an explanatory diagram showing the relationship between calibration accuracy and required time where FIG. 27(a) is used. As one example of the calibration system, there is considered, as shown in FIG. 27(a), a system in which the output of an oscillator circuit VCO whose frequency can be varied with respect to an input code is counted by a counter COUNT to thereby correct the optimal value for the input code. In the present system, for example, a frequency difference f2−f1 obtained when the input code of VCO is changed from C1 to C2 is detected as a difference N2−N1 in the number of counts by the counter CUNT. Thus, the frequency difference is converted from the count difference, whereby the optimal input code is searched. When the corresponding system is used, a time of 12.2 ms is mathematically required as shown in FIG. 27(b) in order to obtain the above accuracy of detection of 25 kHz as f2−f1. In order to further reduce code uncertainty by logic, a time equal to two or three times the above time is considered to be required actually. Thus, the corresponding system makes it difficult to meet the demand for (2) the speeding-up referred to above.

It is also considered that such a calibration system as described in, for example, the non-patent document 1 is used. Since, however, the corresponding system is of a system for searching for the optimal code of the digital-analog converter DAC with the analog circuit as the principal part, particularly, there is the fear of an increase in circuit area with the digital-analog converter DAC, and there is a possibility that the demand for (3) the reduction in area is not sufficiently satisfied.

The present invention has been made in view of the foregoing. The above and other objects and novel features of the present invention will be apparent from the description of the specification and the accompanying drawings.

A summary of a typical embodiment of the invention disclosed in the present application will be briefly explained as follows:

A high frequency signal processing device according to the present embodiment includes an oscillator circuit of which the oscillation frequency is controlled according to an analog control signal and a first modulation code signal, a divider which divides an output of the oscillator circuit, an analog loop control circuit, a digital loop control circuit (digital calibration circuit) and a calibration controller. The analog loop control circuit compares the phase of the output of the divider and the phase of a reference oscillation signal and generates the analog control signal according to the result of comparison by the analog loop control circuit. The first modulation code signal is of a code signal for determining the amount of change in frequency for frequency modulation performed in the oscillator circuit. The digital loop control circuit compares the phase of the output of the divider and the phase of the reference oscillation signal, and searches for the optimal value of the code signal according to the result of comparison by the digital loop control circuit. Upon this search, the calibration controller sets a first division ratio (e.g., division ratio corresponding to a center frequency) to the divider and determines the value of the analog control signal using the analog loop control circuit. Then, in a state in which the value of the analog control signal is held, the calibration controller sets a second division ratio (e.g., division ratio corresponding to a center frequency+amount of change in frequency) to the divider and causes the digital loop control circuit to search for the optimal value of the first modulation code signal. The optimal value determined by the result of search is used at the modulation during the normal operation (transmission operation).

Searching for the optical code used at the modulation using the digital calibration circuit in this way makes it possible to realize high-accuracy modulation using the PLL circuit. Since the digital calibration circuit is configured by the digital circuit, it is possible to reduce area overhead.

An advantageous effect obtained by a typical embodiment of the invention disclosed in the present application will be briefly explained. It is possible to achieve high-accuracy modulation using the PLL circuit.

BRIEF DESCRIPTION OF THE DRAWINGS

FIGS. 2(a) through 2(c) show a configuration example on which attention has been focused when the high frequency signal processing device of FIG. 1 performs its normal operation, in which FIG. 2(a) is a circuit block diagram of its configuration example, and FIGS. 2(b) and 2(c) are respectively explanatory diagrams showing a simple operation example of FIG. 2(a);

FIGS. 3(a) and 3(b) show a configuration example on which attention has been focused when the high frequency signal processing device of FIG. 1 performs its calibration operation, in which FIG. 3(a) is a circuit block diagram thereof, and FIG. 3(b) is a flow diagram showing a schematic operation example of FIG. 3(a);

FIGS. 8(a) and 8(b) respectively show one example of a calibration sequence using the digital calibration circuit of FIG. 6, in which FIGS. 8(a) and 8(b) are diagrams showing one example illustrative of operation waveforms of major parts thereof;

FIGS. 10(a) and 10(b) respectively show one example of a result of calculations of various performance, which have been performed as targeted for the digital calibration circuit of FIG. 6, in which FIG. 10(a) is a table in which design values and input conditions thereof are summarized, and FIG. 10(b) is a table in which results of trial calculations are summarized;

FIGS. 11(a) and 11(b) show the high frequency signal processing device according to the first embodiment of the present invention, in which FIG. 11(a) is a block diagram showing one example of its overall configuration, and FIG. 11(b) is a circuit block diagram showing a configuration example of an RF frontend unit in FIG. 11(a);

FIGS. 13(a) through 13(c) show the calibration sequence of FIG. 12, in which FIG. 13(a) illustrates a mode: 0 in the calibration sequence of FIG. 12, FIG. 13(b) is an explanatory diagram showing a transition example of ideal calibration codes with execution of FIG. 13(a), and FIG. 13(c) is an explanatory diagram showing an actual transition example with respect to FIG. 13(b);

FIG. 14 is a diagram showing one example illustrative of rough times required in respective modes of the calibration sequences of FIG. 12;

FIGS. 18(a) and 18(b) show the capacitor bank of FIG. 16, in which FIG. 18(a) is a schematic diagram showing a layout configuration example of a part thereof, and FIG. 18(b) is a schematic diagram showing a layout configuration example taken as a target for comparison of FIG. 18(a);

FIGS. 20(a) and 20(b) show a high frequency signal processing device according to a fourth embodiment of the present invention, in which FIG. 20(a) is a typical diagram showing a layout configuration example of an oscillator circuit of FIG. 1, and FIG. 20(b) is a typical diagram showing a layout configuration example targeted for comparison thereof;

FIGS. 23(a) through 23(c) show the details of FIG. 22(b), in which FIG. 23(a) is a circuit block diagram showing a configuration example thereof, FIG. 23(b) is a diagram showing one example of an output waveform of a voltage controlled oscillator in FIG. 23(a), and FIG. 23(c) is a diagram showing one example of an output spectrum of the voltage controlled oscillator in FIG. 23(a);

FIGS. 25(a) and 25(b) show a result obtained by discussing an accuracy aspect as targeted for the transmission system circuit of FIG. 23(a), in which FIG. 25(a) is a typical diagram showing a simulation model thereof, and FIG. 25(b) is a diagram showing a simulation result;

FIGS. 27(a) and 27(b) show one example of a calibration system relative to the transmission system circuit shown in FIG. 23(a), in which FIG. 27(a) is a conceptual diagram showing its configuration example and operation example, and FIG. 27(b) is an explanatory diagram showing the relationship between calibration accuracy and necessary time where FIG. 27(a) is used.

DETAILED DESCRIPTION

Figure 1:
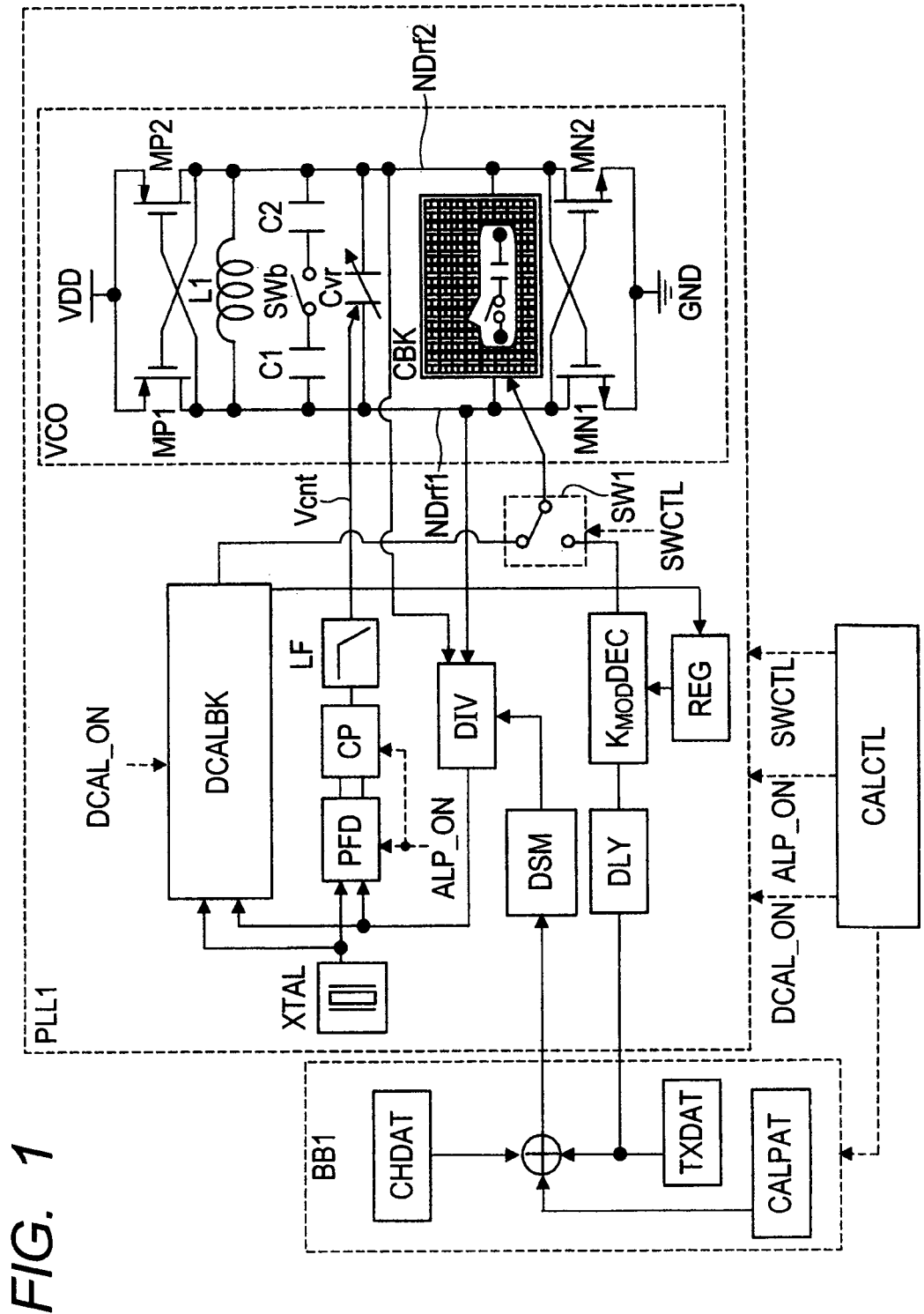
FIG. 1 is a circuit block diagram showing a configuration example of a major part of a high frequency signal processing device according to a first embodiment of the present invention.

Whenever circumstances require it for convenience in the following embodiments, the subject matter will be described by being divided into a plurality of sections or embodiments. However, unless otherwise specified in particular, they are not irrelevant to one another. One thereof has to do with modifications, details, supplementary explanations and the like of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Circuit elements that configure respective functional blocks of the embodiments are not limited in particular, but formed over a semiconductor substrate like monocrystalline silicon by an IC technology of known CMOS (complementary MOS transistors) or the like. Incidentally, MOSFETs (Metal Oxide Semiconductor Field Effect Transistors) (abbreviated as MOS transistors) are used as one example of MISFETs (Metal Insulator Semiconductor Field Effect Transistors), but a non-oxide film will not be excluded as a gate insulating film. Preferred embodiments of the present invention will hereinafter be described in detail based on the accompanying drawings. Incidentally, the same reference numerals are respectively attached to the same components or members in principle in all the drawings for describing the embodiments, and their repetitive description will be omitted.

First Embodiment

Configuration and Operation of High Frequency Signal Processing Device (Major Part)

FIG. 1 is a circuit block diagram showing a configuration example of a major part of a high frequency signal processing device according to a first embodiment of the present invention. The high frequency signal processing device shown in FIG. 1 includes a baseband processing circuit BB1, a PLL circuit (PLL1), and a calibration controller CALCTL. The PLL1 includes a crystal oscillator XTAL, a phase frequency detector PFD, a charge pump circuit CP, a loop filter LF, an oscillator circuit VCO, a divider DIV, a delta-sigma modulator DSM, a delayer DLY, a modulation decoder $K_{MOD}$DEC, a register REG, a switch circuit SW1 and a digital calibration circuit DCALBK.

The baseband processing circuit BB1 generates channel data CHDAT, transmission data TXDAT, and a calibration pattern CALPAT. The calibration controller CALCTL controls the execution of a calibration sequence. Described concretely, the calibration controller CALCTL controls the validity (on)/invalidity (off) of the digital calibration circuit DCALBK using a digital on signal DCAL_ON, controls the validity (on)/invalidity (off) of an analog loop using an analog on signal ALP_ON, controls a destination for coupling to the switch circuit SW1 using a switch control signal SWCTL, and sets the values of CHDAT, TXDAT and CALPAT in conjunction with the baseband processing circuit BB1. The PLL circuit PLL1 has a configuration in which the modulation decoder $K_{MOD}$DEC, register REG, switch circuit SW1 and digital calibration circuit DCALBK are added thereto as compared with the PLL circuit of FIG. 23(a) referred to above. The baseband processing circuit BB1 has a configuration in which the CALPAT is added thereto as compared with the baseband processing circuit of FIG. 23(a).

Figure 2A:
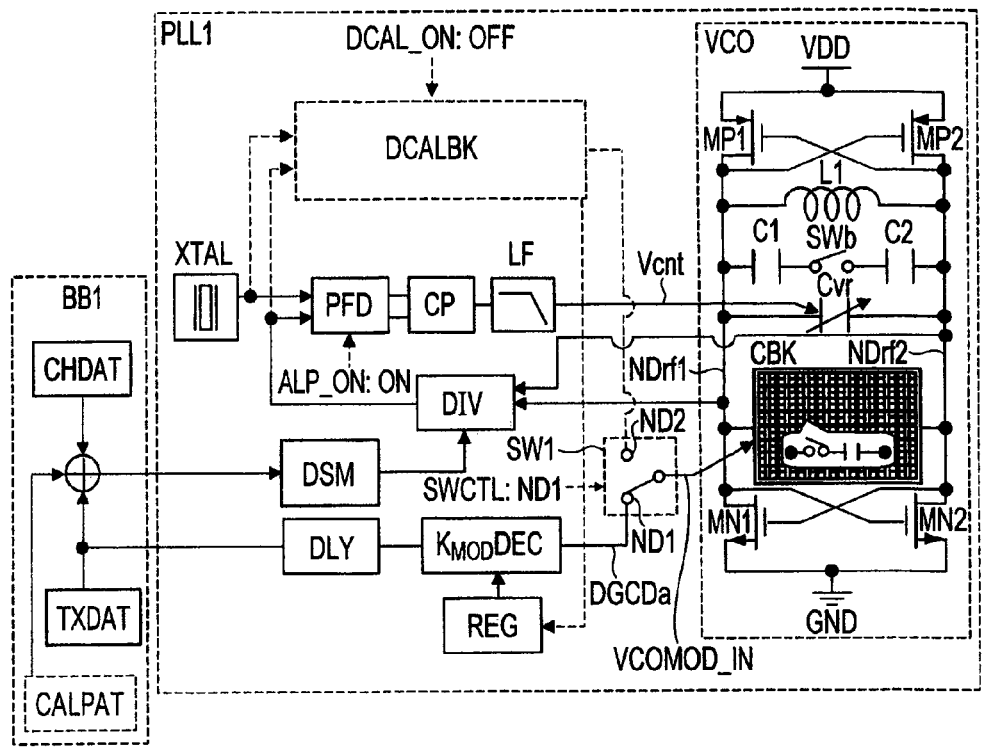
Figure 2B:
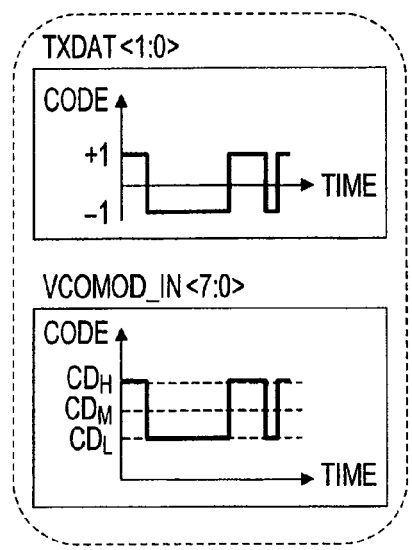
Figure 2C:
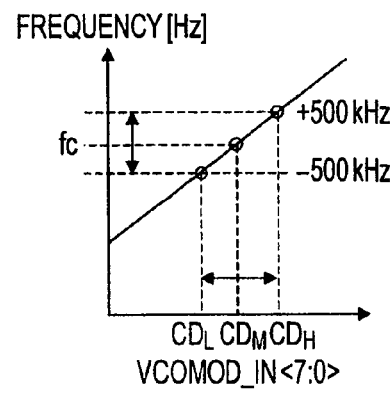
Figure 23A:
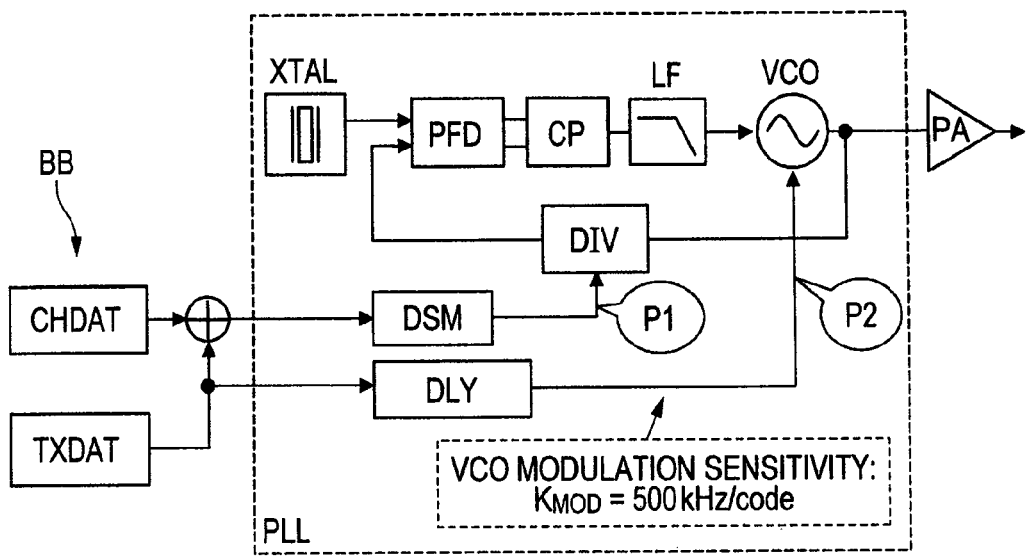
Figure 23B:
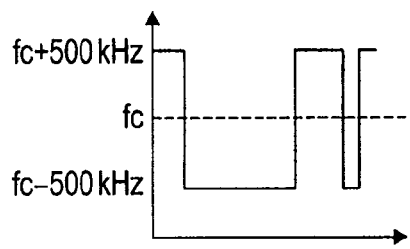
Figure 23C:
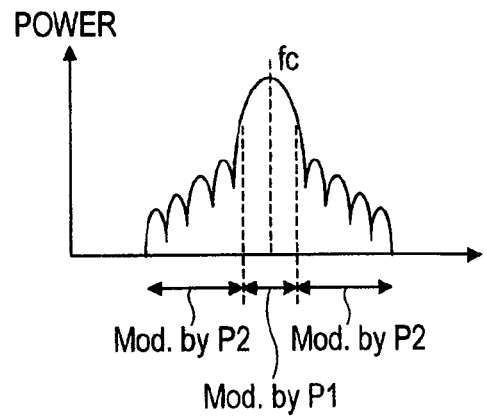
Figure 24A:
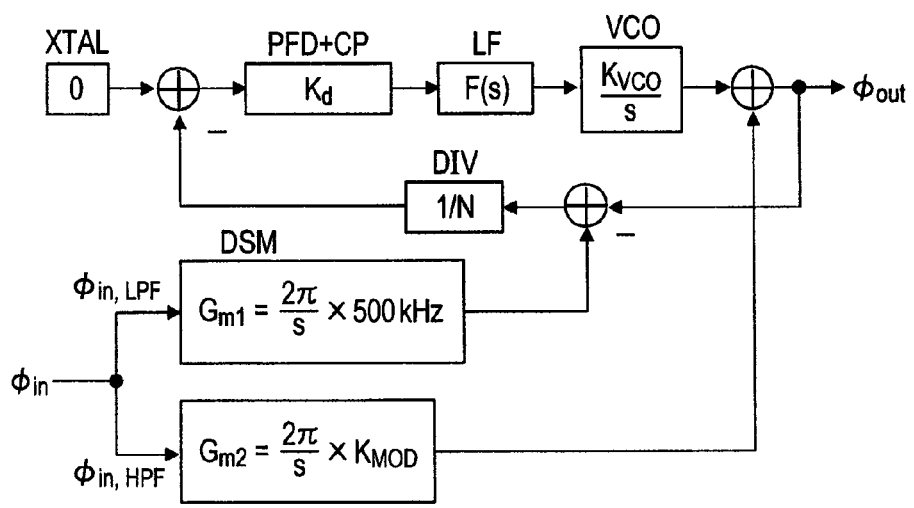
FIGS. 24(a) and 24(b) are diagrams showing a transfer function model of a two-point modulation system.
Figure 24B:
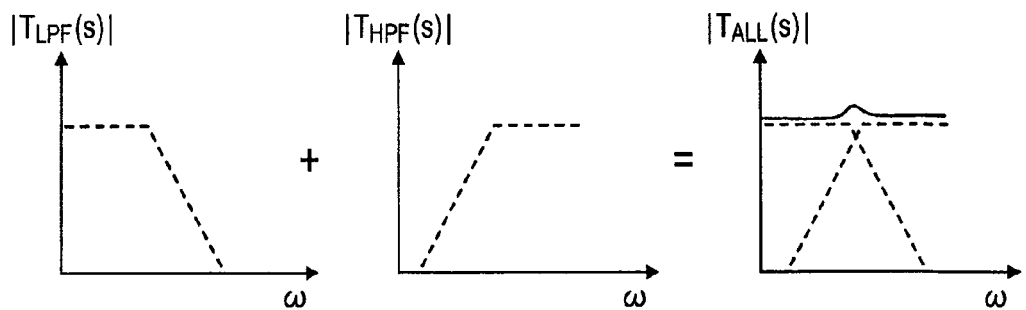
Figure 25A:
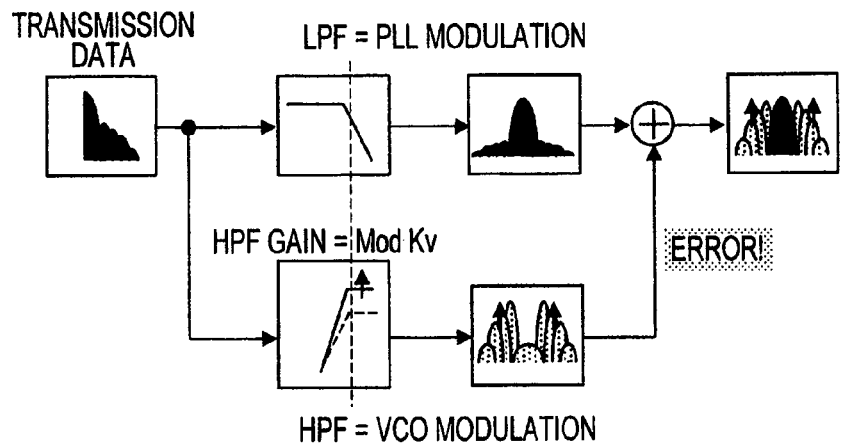
Figure 25B:
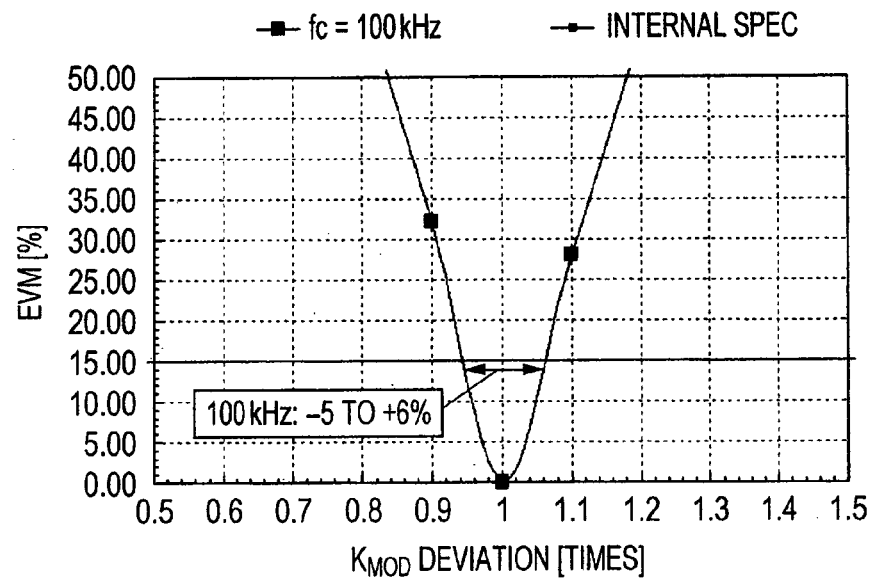

FIG. 2(a) is a circuit block showing a configuration example on which attention has been focused when the high frequency signal processing device of FIG. 1 performs its normal operation (transmission operation), and FIGS. 2(b) and 2(c) are respectively explanatory diagrams showing a simple operation example of FIG. 2(a). In FIG. 2(a), circuits each serving as a main body upon the normal operation (transmission operation) are shown in solid lines, and circuits other than those circuits are shown in broken lines. When the PLL circuit (PLL1) performs the normal operation, the digital calibration circuit DCALBK is set to off with control of the calibration controller CALCTL to set the analog loop to on, so that the coupling destination of the switch circuit SW1 is set to the node ND1 side. An oscillation signal of the oscillator circuit VCO is divided by the divider DIV, and the phase frequency detector PFD compares the phase of an output signal of the divider DIV and the phase of an oscillation signal of the crystal oscillator XTAL and controls the charge pump circuit CP according to the result of comparison thereof. The charge pump circuit CP generates a discharging or charging current corresponding to this control. The corresponding current is averaged and converted to a voltage control signal Vcnt by the loop filter LF. The oscillation frequency of the oscillator circuit VCO is controlled according to the magnitude of the voltage control signal Vcnt. As shown in FIG. 23(a), the divider DIV is able to set a division ratio (1/X) (where X includes a decimal point) including a decimal point using a system called a fractional N along with the delta-sigma modulator DSM.

The oscillator circuit VCO includes PMOS transistors MP1 and MP2, NMOS transistors MN1 and MN2, an inductor L1, capacitors C1 and C2, a switch circuit SWb, a variable capacitor (varactor capacitor) Cvr, and a capacitor bank CBK and serves as an LC-resonance type oscillator circuit. The PMOS transistors MP1 and MP2 respectively have sources coupled to a power supply voltage VDD and gate and drains cross-coupled to one another (one gates thereof are respectively intercoupled to the other gates thereof). The NMOS transistors MN1 and MN2 respectively have sources coupled to a ground power supply voltage GND and gates and drains cross-coupled to one another. The drain of the PMOS transistor MP1 and the drain of the NMOS transistor MN1 are coupled to an oscillation output node NDrf1. The drain of the PMOS transistor MP2 and the drain of the NMOS transistor MN2 are coupled to an oscillation output node NDrf2.

The inductor L1, varactor capacitor Cvr and capacitor bank CBK are respectively coupled in parallel between the oscillation output nodes NDrf1 and NDrf2. The capacitor C1, the switch circuit SWb and the capacitor C2 are coupled in series from the oscillation output nodes NDrf1 to NDrf2 in this order. The varactor capacitor Cvr has a capacitance value controlled by the voltage control signal Vcnt outputted from the loop filter LF. The capacitor C1, the switch circuit SWb and the capacitor C2 that serve as a series circuit is of a circuit for setting a frequency range. Although one set is shown as typical, similar series circuits are provided as plural sets in parallel between the oscillation output nodes NDrf1 and NDrf2. An inductance value for a resonant frequency where no modulation is conducted, is determined by the inductor L1, and a capacitance value is determined by the capacitors C1, C2 and the varactor capacitor Cvr of a set where the switch circuit SWb is driven on. That is, a rough frequency setting is conducted by its corresponding frequency range setting circuit, and a detailed frequency setting is conducted by the varactor capacitor Cvr. The capacitor bank CBK includes a plurality of capacitors provided thereinside. When a set signal is inputted, the capacitor bank CBK couples a predetermined capacitor corresponding to the set signal to the oscillation output nodes NDrf1 and the NDrf2.

The configuration example of FIG. 2(a) uses such a two-point modulation system as mentioned in FIG. 23(a) and includes a modulation pass (PLL modulation pass) performed on the divider DIV, and a modulation pass (VCO modulation pass) performed on the oscillator circuit VCO. In the PLL modulation pass, the division ratio of the divider DIV is switched as appropriate based on the channel data CHDAT and transmission data TXDAT of the baseband processing circuit BB1 so that modulation is applied to the oscillation frequency of the oscillator circuit VCO through the voltage control signal Vcnt. On the other hand, in the VCO modulation pass, the modulation decoder $K_{MOD}$DEC generates a digital code signal DGCDa, based on the transmission data TXDAT and information of the register REG. During the normal operation, the switch circuit SW1 couples the capacitor bank CBK to the node ND1 side. The digital code signal DGCDa is inputted to the capacitor bank CBK as a modulation set signal VCOMOD_IN through the switch circuit SW1, and modulation is applied to the oscillation frequency of the oscillator circuit VCO via the capacitor bank CBK.

Described concretely, as shown in FIG. 2(b), for example, a code of +1 or −1 is generated on a time sequence basis as transmission data TXDAT and inputted to the modulation decoder $K_{MOD}$DEC via the delayer DLY. As mentioned in FIG. 23(a), the delayer DLY performs an adjustment to a delay time between the VCO modulation pass and the PLL modulation pass. Here, the optimum codes $CD_H$ (for +500 kHz) and $CD_L$ (for −500 kHz) required to perform a modulation of ±Δf (±500 kHz herein) during the VCO modulation pass have been stored in the register REG in advance by a calibration operation to be described later. The modulation decoder $K_{MOD}$DEC outputs a middle code CDM to the modulation set signal VCOMOD_IN during non-modulation (when the oscillation frequency of the oscillator circuit VCO is set to a channel frequency fc determined based on the channel data CHDAT). On the other hand, during modulation, the modulation decoder $K_{MOD}DEC$ outputs the code $CD_H$ to the VCOMOD_IN depending on +1 of the transmission data TXDAT, and outputs the code $CD_L$ to the VCOMOD_IN depending on −1 of the transmission data TXDAT. Thus, as shown in FIG. 2(c), the modulation of ±500 kHz is performed centering on the channel frequency fc. Incidentally, the capacitor bank CBK couples the capacitance corresponding to the middle code $CD_M$ to the resonant circuit of the oscillator circuit VCO during non-modulation and increases or decreases the corresponding capacitance depending on the code $CD_L$ and $CD_H$ when modulation is conducted.

Figure 3A:
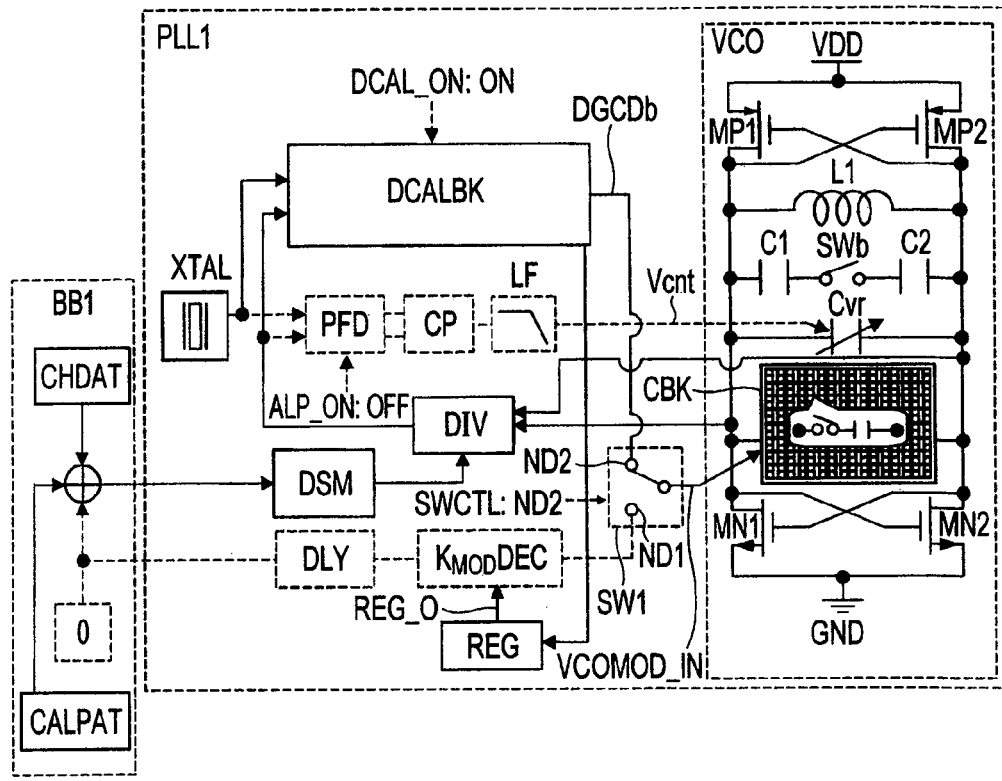
Figure 3B:
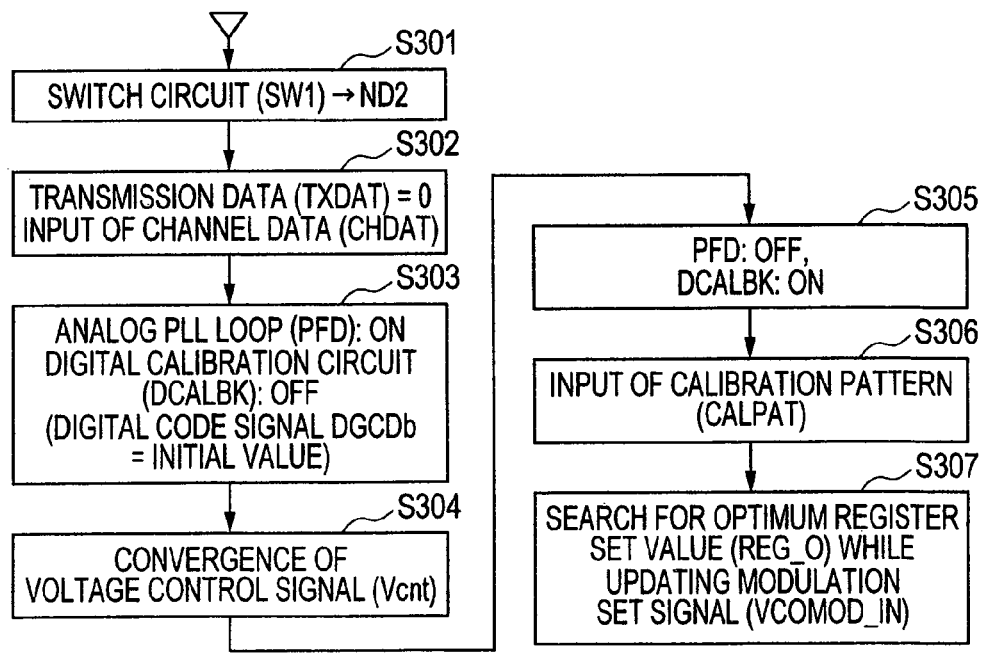

FIG. 3(a) is a circuit block diagram showing a configuration example on which attention has been focused when the high frequency signal processing device of FIG. 1 performs its calibration operation. FIG. 3(b) is a flow diagram showing a schematic operation example of FIG. 3(a). In FIG. 3(a), circuits each of which serves as a main body upon the calibration operation are shown in solid lines, and circuits other than those circuits are shown in broken lines. When the PLL circuit (PLL1) performs the calibration operation, the switch circuit SW1 first couples the capacitor bank CBK to the node ND2 (digital calibration circuit DCALBK) side according to the control of the calibration controller CALCTL of FIG. 1 (S301). In the baseband processing circuit BB1, transmission data TXDAT is set to "0" and predetermined channel data (CHDAT) is set according to the control of the calibration controller CALCTL (S302).

Further, according to the control of the calibration controller CALCTL, the phase frequency detector PFD is set on, and the digital calibration circuit DCALBK is set off (S303). Analog loop control by VCO, DIV, PFD, CP and LF in this order is performed by these, so that the oscillation frequency of the oscillator circuit VCO is set to a frequency fc corresponding to the channel data CHDAT, and the value of a voltage control signal Vcnt at this time is determined (S304). Here, upon the analog loop control, the digital calibration circuit DCALBK outputs an initial value as a digital code signal DGCDa with its off setting. The capacitance of the capacitor bank CBK is set to the value of $CD_M$ with the initial value of the digital code signal DGCDa.

Next, according to the control of the calibration controller CALCTL, the phase frequency detector PFD is set to off and the digital calibration circuit DCALBK is set to on (S305). Consequently, the value of the voltage control signal Vcnt is held by the loop filter LF. The baseband processing circuit BB1 outputs a calibration pattern CALPAT according to the control of the calibration controller CALCTL (S306). The calibration pattern CALPAT is a pattern for specifying a division ratio necessary to allow the divider DIV to carry out a frequency increase or decrease in +Δf (+500 kHz herein) or −Δf (−500 kHz herein). When +Δf (+500 kHz) is specified by the calibration pattern CALPAT, for example, a target value of the oscillation frequency of the oscillator circuit VCO is set to "fc+500 kHz" obtained by adding a frequency fc accompanying the channel data CHDAT and +Δf (+500 kHz) through the delta-sigma modulator DSM and the divider DIV. During the calibration operation, digital loop control using the VCO, DIV and DCALBK in this order is conducted instead of the analog loop control conducted via the phase frequency detector PFD in such a manner that the oscillation frequency converges to this target value.

Although the details of the digital calibration circuit DCALBK will be described later, the digital calibration circuit DCALBK digitally compares the phase of the output signal of the divider DIV and the phase of the oscillation signal from the crystal oscillator XTAL and updates the value of a digital code signal DGCDb according to the result of comparison by the digital calibration circuit DCALBK. The digital code signal DGCDb is inputted to the capacitor bank CBK as a modulation set signal VCOMOD_IN via the switch circuit SW1. Correspondingly, the capacitance value of the capacitor bank CBK is updated and the oscillation frequency of the oscillator circuit VCO is updated. As a result, when the digital loop control converges, the code for the modulation set signal VCOMOD_IN inputted to the capacitor bank CBK becomes a code required to apply a modulation of +500 kHz with the frequency fc as a reference. To this end, the digital calibration circuit DCALBK stores the corresponding code in the register REG as a code optimal at the +500 kHz modulation. Further, the digital calibration circuit DCALBK searches for the optimal code similarly even when −Δf (−500 kHz) is specified by the calibration pattern CALPAT, and stores it in the register REG (S307).

During the normal operation (at the modulation), the optimal code stored in the register REG by the modulation decoder $K_{MOD}DEC$ is used as mentioned in FIG. 2. During the normal operation, the digital calibration circuit DCALBK is controlled to an off state (inactive state) for the purpose of a reduction in power consumption or the like. Incidentally, here, the value of VCOMOD_IN is set to the value of DGCDa or the value of DGCDb using the switch circuit SW1, and further, the digital calibration circuit DCALBK is brought to the off state in a state in which the value of VCOMOD_IN is set to the value of DGCDb, whereby the value of VCOMOD_IN was set to an initial value. Thus, in the present embodiment, a code selecting means may be provided which is capable of setting the value of VCOMOD_IN to the value of DGCDa or the value of DGCDb. A system for achieving it can be implemented by various systems even at other than the system of FIG. 3. For example, the digital code signals DGCDa and DGCDb are bus-coupled to the modulation set signal VCOMOD_IN and one thereof is selectively controlled to a high impedance state, whereby either the value of DGCDa or the value of DGCDb may be selected. The initial value may be provided in such a manner that the capacitor bank CBK itself sets the value of $CD_M$ according to the control signal, or by setting the switch circuit as three inputs (DGCDa, DGCDb and initial value). Alternatively, the initial value may be outputted from the DGCDa side.

Figures 4, 5:
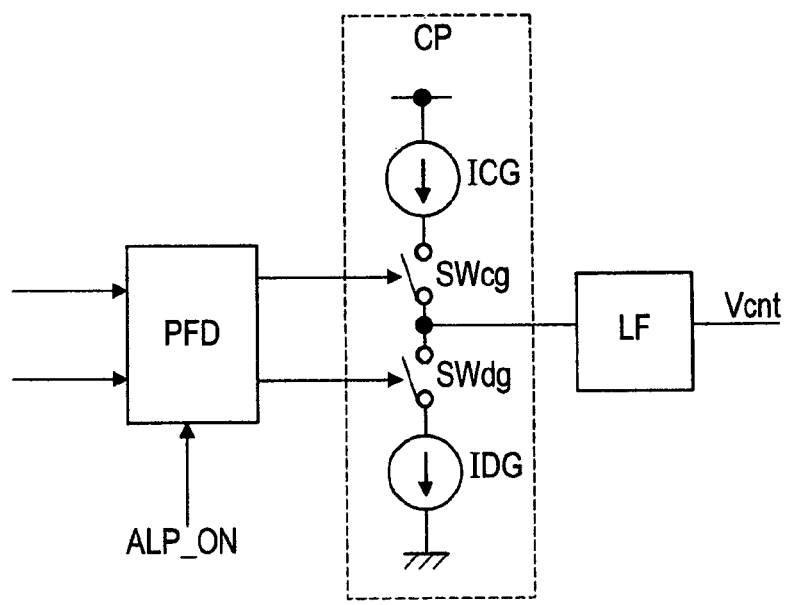
FIG. 4 is a circuit block diagram showing a detailed configuration example of a periphery of a charge pump circuit in the high frequency signal processing device of FIG. 1.
FIG. 5 is a table showing, as one example, a summary of principal performance of a digital calibration circuit in the high frequency signal processing device of FIG. 1.

FIG. 4 is a circuit block diagram showing a detailed configuration example of the periphery of the charge pump circuit CP in the high frequency signal processing device of FIG. 1. As shown in FIG. 4, the charge pump circuit CP allows a charging current based on a constant current circuit ICG to flow into the loop filter LF when a switch circuit SWcg is controlled to be on and allows a discharging current based on a constant current circuit IDG to flow into the loop filter LF when a switch circuit SWdg is controlled to be on. The On/Off of each of the switch circuits SWcg and SWdg is controlled by the phase frequency detector PFD. When an analog on signal ALP_ON is controlled to be off by the calibration controller CALCTL of FIG. 1, the phase frequency detector PFD controls the switch circuits SWcg and SWdg to on together, and hence a voltage control signal Vcnt at that time is retained by the loop filter LF.

<<Main Advantageous Effects of High Frequency Signal Processing Circuit (Major Part)>>

Advantageous effects of (1) an improvement in accuracy, (2) speeding-up and (3) a reduction in area are principally obtained by performing such a calibration operation as described in FIG. 3 using the high frequency signal processing device of FIG. 1 as described above. To being with, as to the improvement in accuracy, the optimal code (modulation set signal VCOMOD_IN) used upon modulation with a highprecision oscillation signal from the crystal oscillator XTAL being targeted for comparison is searched during the calibration operation as mentioned in FIG. 3. For this reason, a code obtained from the result of its search is also brought to high accuracy. The smaller the setting resolution frequency related to the frequency at the capacitor bank CBK, the higher the accuracy. When the setting resolution frequency is set to 10 kHz, for example, an accuracy of ±10 kHz/2480 MHz≈4 ppm or so can be expected assuming that a shift of ±1 code is taken as the accuracy.

Figure 27A:
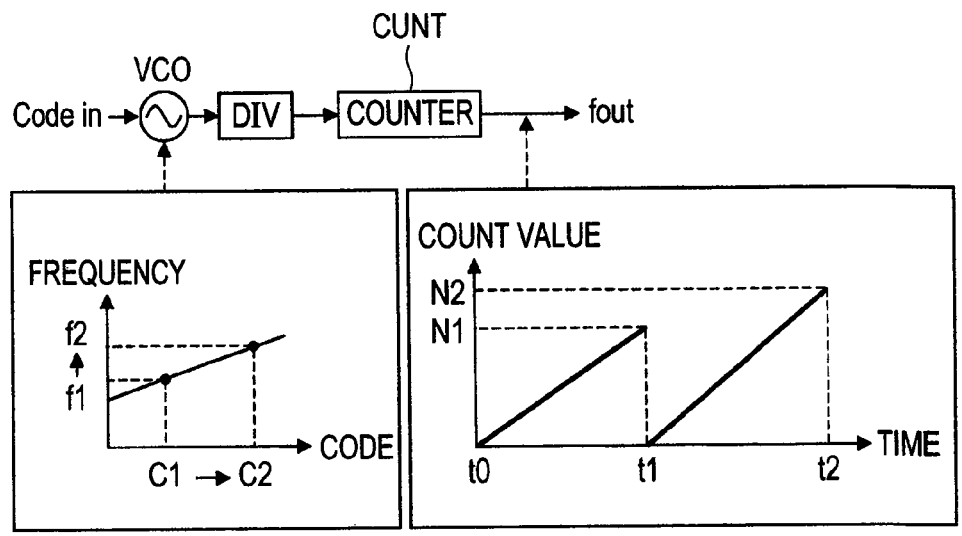
Figure 27B:
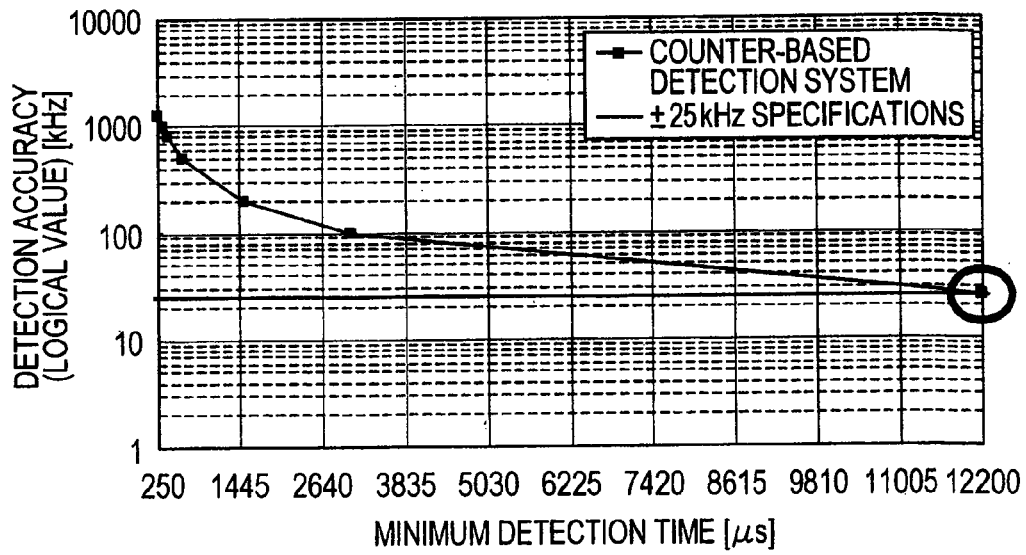

Next, as to (2) the speeding-up, the time necessary for calibration is determined depending on an approximately loop's damping time because the closed loop system using the digital calibration circuit DCALBK without using the open loop system based on such a frequency count as described in FIG. 27, for example, is used. This damping time can be designed to 16 µs or so, for example. Even though the damping operation is conducted twice for searching a code on the +Δf side and a code on the −Δf side, the damping time becomes 32 µs. Even inclusive of a digital processing time, the time necessary for calibration can be suppressed to sufficiently within 71 µs. As to (3) the reduction in area, a reduction in circuit area can be achieved by configuring the digital calibration circuit DCALBK by digital circuits all. Along with it, a further reduction in area can be achieved with process miniaturization.

FIG. 5 is a table showing, as one example, a summary of principal performance of the digital calibration circuit DCALBK in the high frequency signal processing device of FIG. 1. Although the detailed contents of the digital calibration circuit DCALBK will be described later, a calibration accuracy of 5 ppm, a required calibration time of 66 µs and a DCALBK area of 0.04 mm² can be achieved by using the above-described calibration system based on the digital calibration circuit DCALBK. Incidentally, as target values for realizing sufficient calibration performance, for example, the calibration accuracy is 10 ppm or less, the required calibration time is 71 µs or less, and the area overhead accompanying the calibration circuit is 0.05 mm² or less. They can hence satisfy any of the target values.

<<Details of Digital Calibration Circuit>>

Figure 6:
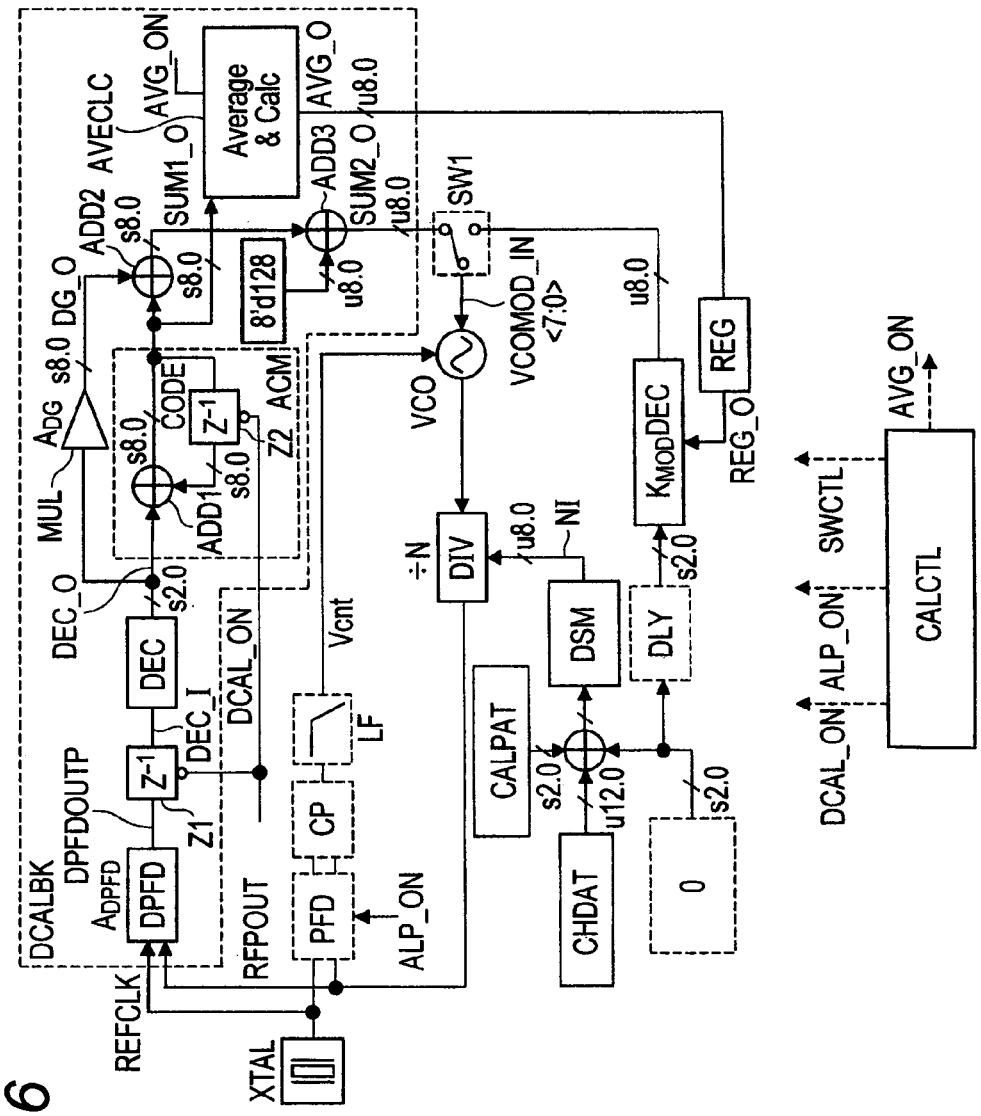
FIG. 6 is a circuit block diagram showing a detailed configuration example of the digital calibration circuit in the high frequency signal processing device of FIG. 1.

FIG. 6 is a circuit block diagram showing a detailed configuration example of the digital calibration circuit DCALBK in the high frequency signal processing device of FIG. 1. The digital calibration circuit DCALBK shown in FIG. 6 includes a digital phase frequency detector DPFD, latch circuits Z1 and Z2, a decoder DEC, a multiplier MUL, adders ADD1 through ADD3, and an average value calculation circuit AVECLC. The digital phase frequency detector DPFD and the latch circuit Z1 discriminate back-and-forth relations between the phase of an oscillation signal REFCLK generated from a crystal oscillator XTAL and the phase of an oscillation signal RFPOUT fed back via a divider DIV and outputs a signal DEC_I indicative of the result of discrimination thereby. Concretely, for example, the digital phase frequency detector DPFD outputs one shot pulse (DPFDOUTP) in sync with the oscillation signal REFCLK, and the latch circuit Z1 performs a latch operation synchronized with the oscillation signal REPOUT with the one shot pulse as an input to thereby output DEC_I having a value of '1'/'0' according to the phase back-and-forth relations.

The decoder DEC outputs a signal DEC_O having a value of +1/−1 according to '1'/'0' of the signal DEC_I. Incidentally, in FIG. 6, for example, the representation or notation of "s2.0" means 2 bits with a code or sign, and the notation of "u8.0" means code-free 8 bits. The adder ADD1 and the latch circuit Z2 configure an accumulator ACM, and perform cumulative addition of the output value of DEC_O and output a code signal (CODE<7:0>) indicative of the result of cumulative addition. The multiplier MUL multiplies the output value of DEC_O by $A_{DG}$ and outputs a signal (DG_O<7:0>) indicative of the result of multiplication. The adder ADD2 adds the CODE<7:0> and the DG_O<7:0> and outputs a signal SUM1_O<7:0> indicative of the result of addition. The adder ADD3 adds a value of 128 to the result of addition by the adder ADD2 to alter SUM1_O<7:0> to a code-free notation and outputs a signal SUM2_O<7:0> indicative of the result of addition (corresponding to the digital code signal DGCDb of FIG. 3). This SUM2_O<7:0> becomes a modulation set signal VCOMOD_IN<7:0> of an oscillator circuit VCO via a switch circuit SW1.

The average value calculation circuit AVECLC sequentially calculates an average value of the code signal (CODE<7:0> outputted from an accumulator ACM. Then, aiming at average values calculated while an averaging on signal AVG_ON is being asserted or activated, the average value calculation circuit AVECLC calculates an average value of those and performs round-off processing. Then, the value of 128 is added to the calculated value obtained by the above processing to thereby perform conversion into the code-free notation. The average value calculation circuit AVECLC outputs the post-conversion value as a signal AVG_O<7:0> and sets it to its corresponding register REG. Incidentally, in the present example, the latch circuits Z1 and Z2 are activated in response to a digital on signal DCAL_ON outputted from a calibration controller CALCTL. With its activation, the operation of the digital calibration circuit DCALBK itself also becomes effective in response to the digital on signal DCAL_ON.

Figure 7:
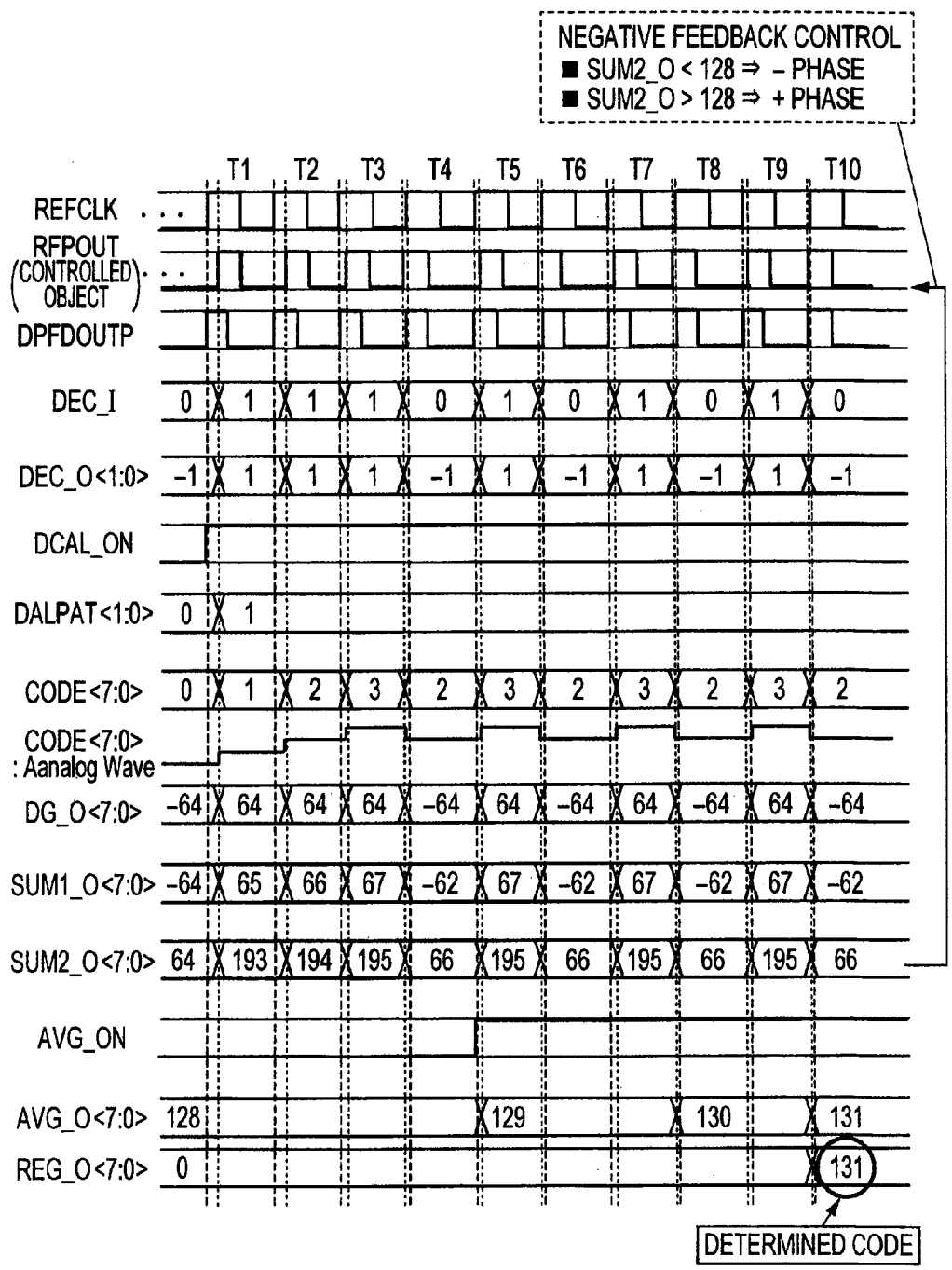
FIG. 7 is a timing chart showing a simple operation example of the digital calibration circuit shown in FIG. 6.

FIG. 7 is a timing chart showing a simple operation example of the digital calibration circuit DCALBK shown in FIG. 6. Now assume where an intermediate code at the time of non-modulation (when the oscillation frequency of the oscillator circuit VCO is given as the channel frequency fc) at the capacitor bank CBK of FIG. 1 or the like is set as 128, and the final code determined by calibration is 131 to provide an easy explanation. In FIG. 7, as an initial state (during a clock cycle T1), the oscillation signal REFCLK generated from the crystal oscillator XTAL leads in phase the oscillation signal RFPOUT outputted from the divider DIV. In this condition, the digital on signal DCAL_ON for starting calibration is asserted so that '1' is outputted as a calibration pattern CALPAT (i.e., the target value of the oscillation frequency of VCO is specified to fc+Δf).

During the clock cycle T1, the digital phase frequency detector DPFD and the latch circuit Z1 compare and determine the phase of REFCLK and the phase of RFPOUT and outputs '1' indicative of the oscillation signal RFPOUT being leading, as the result of comparison/determination (DEC_I). The decoder DEC outputs "1" to the signal DEC_O according to the output of '1' of the above result DEC_I. The accumulator ACM updates the code signal (CODE) from "0" to "1" in response to the output of '1' of the signal DEC_O. The multiplier MUL outputs+$A_{DG}$ (assume $A_{DG}$=64 herein) as a signal DG_O in response to the output of "1" of the signal DEC_O. The adder ADD2 adds the code signal (CODE) and the signal DEC_O and outputs "65" as a signal SUM1_O. The adder ADD3 adds 128 to 65 and outputs "193" as a signal SUM2_O. Thus, the capacitor bank CBK in the oscillator circuit VCO is set to a capacitance value corresponding to "193", so that the phase of the oscillation signal RFPOUT is controlled in its leading direction.

Next, the oscillation signal REFCLK still leads in phase the oscillation signal RFPOUT similarly even during clock cycles T2 and T3. With its operation, the code signal (CODE) is updated from "1" to "2" and "2" to "3", and the signal SUM2_O is updated from "193" to "194" and "194" to "195". Subsequently, during a clock cycle T4, the oscillation signal REFCLK lags in phase the oscillation signal REFOUT in reverse. In this case, the digital phase frequency detector DPFD and the latch circuit Z1 output '0' indicative of the oscillation signal REPOUT being lagging, as DEC_I. The decoder DEC outputs "−1" to the signal DEC_O in response to the output '0' of the signal DEC_I. The accumulator ACM updates the code signal CODE from "3" to "2" in response to the output "−1" of the signal DEC_O. The multiplier MUL outputs −ADS (=−64) as a signal DG_O in response to the output "−1" of the signal DEC_O. The adder ADD2 adds the code signal CODE and the signal DEC_O and outputs "−62" as a signal SUM1_O. The adder ADD3 adds 128 to −62 and outputs "66" as a signal SUM2_O. Thus, the capacitor bank CBK in the oscillator circuit VCO is set to a capacitance value corresponding to "66", so that the phase of the oscillation signal RFPOUT is controlled in its lagging direction.

Next, during a clock cycle T5, the oscillation signal REFCLK leads the oscillation signal RFPOUT in phase again. With an operation similar to the clock cycle T1, the code signal CODE is updated from "2" to "3", and the signal SUM2_O is updated from "66" to "195". Subsequently, during a clock cycle T6, the oscillation signal REFCLK lags the oscillation signal RFPOUT in phase in reverse and hence an operation similar to the clock cycle T4 is carried out. Even during subsequent clock cycles T7 to T10, the leading phase and the lagging phase occur alternately. Since the cycles subsequent to the clock cycle T5 are assumed to be a state in which the settling of the digital loop control has been completed, because the leading phase and the lagging phase occur alternately, the averaging on signal AVG_ON is being asserted during this cycle T5 herein. In response to the activation of the averaging on signal AVG_ON, the average value calculation circuit AVECLC stores the final code 131 (i.e., a result obtained by rounding off 2.5+128) in the register REG, based on the average value of the code signal CODE.

Here, the averaging on signal AVG_ON is outputted by the calibration controller CALCTL. The calibration controller CALCTL activates the averaging on signal AVG_ON when a predetermined time has elapsed after the digital signal DCAL_ON is set on, and subsequently deactivates the averaging on signal AVG_ON when a predetermined time has elapsed. That is, the time taken until the settling is completed after the digital loop control has been rendered effective, can be estimated in the design stage in advance. For this reason, the averaging on signal AVG_ON is controlled using the estimated time herein. However, although a circuit scale increases slightly, for example, the calibration controller CALCTL may monitor the transition of the code signal CODE and activate the averaging on signal AVG_ON when the code signal CODE converges into a predetermined range.

<<Major Features of Digital Calibration Circuit>>

The digital calibration circuit DCALBK shown in FIG. 6 principally has two features as described above. The first feature resides in that the digital calibration circuit DCALBK has a path extending via the multiplier MUL in parallel with a path extending via the accumulator ACM. That is, since the oscillator circuit VCO and the accumulator ACM in the digital loop can actually be assumed to be integrators respectively in terms of transfer functions, although not shown in FIG. 7, there is a fear that the digital loop is placed under positive feedback control where a phase delay of 90° occurs in them. For this reason, there is provided the path extending via the multiplier MUL (e.g., a bit shifter circuit or the like) free of the occurrence of the phase delay, whereby stable negative feedback control can be achieved. Although the multiplying power ($A_{DG}$) made by the multiplier MUL can be arbitrarily set, the adders ADD2 and ADD3 may preferably set to a relatively large value within a range free of the occurrence of an overflow to obtain a satisfactory phase margin characteristic or the like.

Incidentally, as shown in FIG. 7, the value of the frequency set signal (SUM2_O) (modulation set signal VCOMOD_IN) relative to the oscillator circuit VCO with the multiplier MUL fluctuates with amplitude between $+A_{DG}$ and $-A_{DG}$ with a value obtained by adding 128 to the code signal CODE being taken as a center value. In this case, the oscillator circuit VCO has such a characteristic as to integrate the frequency set signal and generate a phase. Consequentially, the digital loop converges in such a manner that the frequency obtained by dividing the oscillation frequency corresponding to the center value of the frequency set signal SUM2_O by the divider DIV coincides with the frequency of the oscillation signal REFCLK. Thus, the final code determined by calibration also becomes the value (the center value of the frequency set signal SUM2_O at the convergence) obtained by adding 128 to the value of the code signal at the convergence.

The second feature resides in that the average value calculation circuit AVECLC performs the presence or absence of the convergence of the digital loop and the calculation of the final code, using the code signal CODE. The operation of the average value calculation circuit AVECLC can also be carried out using the signal SUM2_O or the like, for example. Since, however, the signal SUM2_O fluctuates greatly as mentioned above, the number of digits for numerical calculations increases. On the other hand, when the code signal CODE is used, the number of digits for numerical calculations can be suppressed, and a reduction in circuit area can be achieved.

<<One Example of Calibration Sequence>>

Figure 8A:
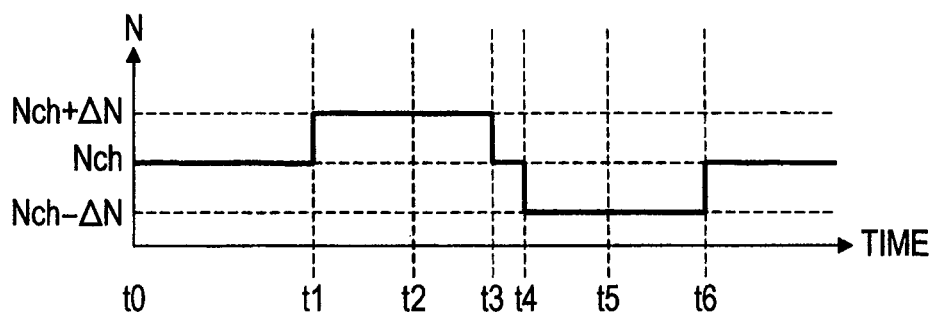
Figure 8B:
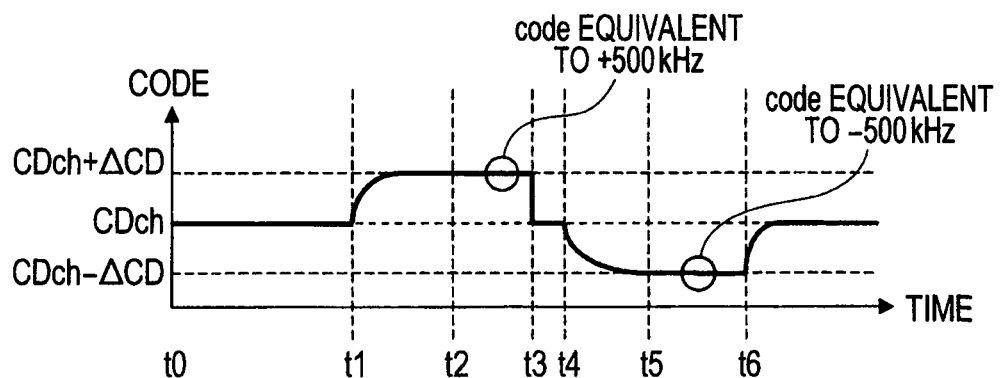

FIGS. 8(a) and 8(b) respectively show one example of a calibration sequence using the digital calibration circuit DCALBK of FIG. 6, in which FIGS. 8(a) and 8(b) respectively show one example illustrative of operation waveforms of major parts thereof. The entire control of the calibration sequence is performed by the calibration controller CALCTL of FIG. 1 (FIG. 6). A set value (NI) of the divider DIV, which becomes an input value for calibration, is shown in FIG. 8(a). The value of the code signal CODE, which becomes an output value for calibration, is shown in FIG. 8(b). In FIGS. 8(a) and 8(b), during a period between t0 and t1, the analog loop is rendered effective according to on of the analog signal ALP_ON as described in FIG. 3, and the digital loop is rendered ineffective according to off of the digital on signal DCAL_ON. The set value (NI) of the division ratio is Nch corresponding to the channel frequency fc, and the value of the code signal CODE is CDch. CDch is "0", for example, and the modulation set signal VCOMOD_IN assumes "128" with its value. Thus, the voltage control signal Vcnt of the oscillator circuit VCO converges to a value corresponding to the channel frequency fc.

Next, at t1, the operations of the phase frequency detector PFD and the charge pump circuit CP in the analog loop are inactivated depending on off of the analog on signal ALP_ON, so that the value of the voltage control signal Vcnt is held by the loop filter LF. Then, the set value (NI) of the division ratio is set to Nch+ΔN equivalent to +500 kHz. Thus, the digital calibration circuit DCALBK becomes effective according to on of the digital on signal DCAL_ON and hence the settling of the digital loop is carried out during a period between t1 and t2. During a period between t2 to t3 after the settling, the averaging on signal AVG_ON is activated, and the value of the code signal CODE during this period is averaged by the average value calculation circuit AVECLC, whereby the value of the code signal CODE on the high side (CDch+ΔCD) is determined, and a value obtained by adding "128" to the so-determined value is stored in the register REG.

Figure 26:
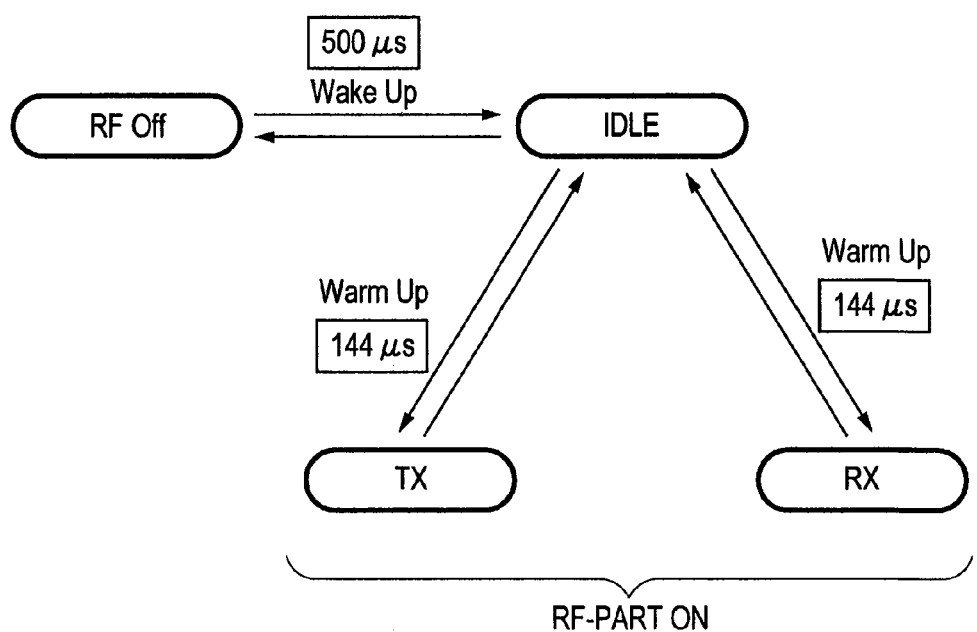
FIG. 26 is a state transition diagram showing one example of an operation mode used in a Zigbee (registered trademark) system.

Subsequently, during a period between t3 and t4, the accumulator ACM in the digital loop is reset. Thus, in a manner similar to the period between t0 and t1, the set value (NI) of the division ratio is restored to Nch, and the analog signal ALP_ON is turned on and the digital on signal DCAL_ON is turned off, so that the voltage control signal Vcnt converges to the value corresponding to the channel frequency fc. During periods between t4 and t5 and between t5 and t6, operations similar to those conducted during the periods from t1 to t2 and t2 to t3 referred to above are carried out with the set value (NI) of the division ratio as Nch−ΔN equivalent to −500 kHz. Thus, the value (CDch−ΔCD) of the code signal CODE on the low side is determined and a value obtained by adding "128" to the so-determined value is stored in the register REG. Such a calibration operation is performed during such a warm-up period as shown in FIG. 26, for example. After the lapse of the periods from t0 to t6, the analog loop is rendered effective and the digital loop is rendered ineffective, whereby transition to a transmission mode (TX) is conducted. In the transmission mode (TX), modulation using CDch+ΔCD and CDch−ΔCD is performed depending on transmission data.

Figure 9:
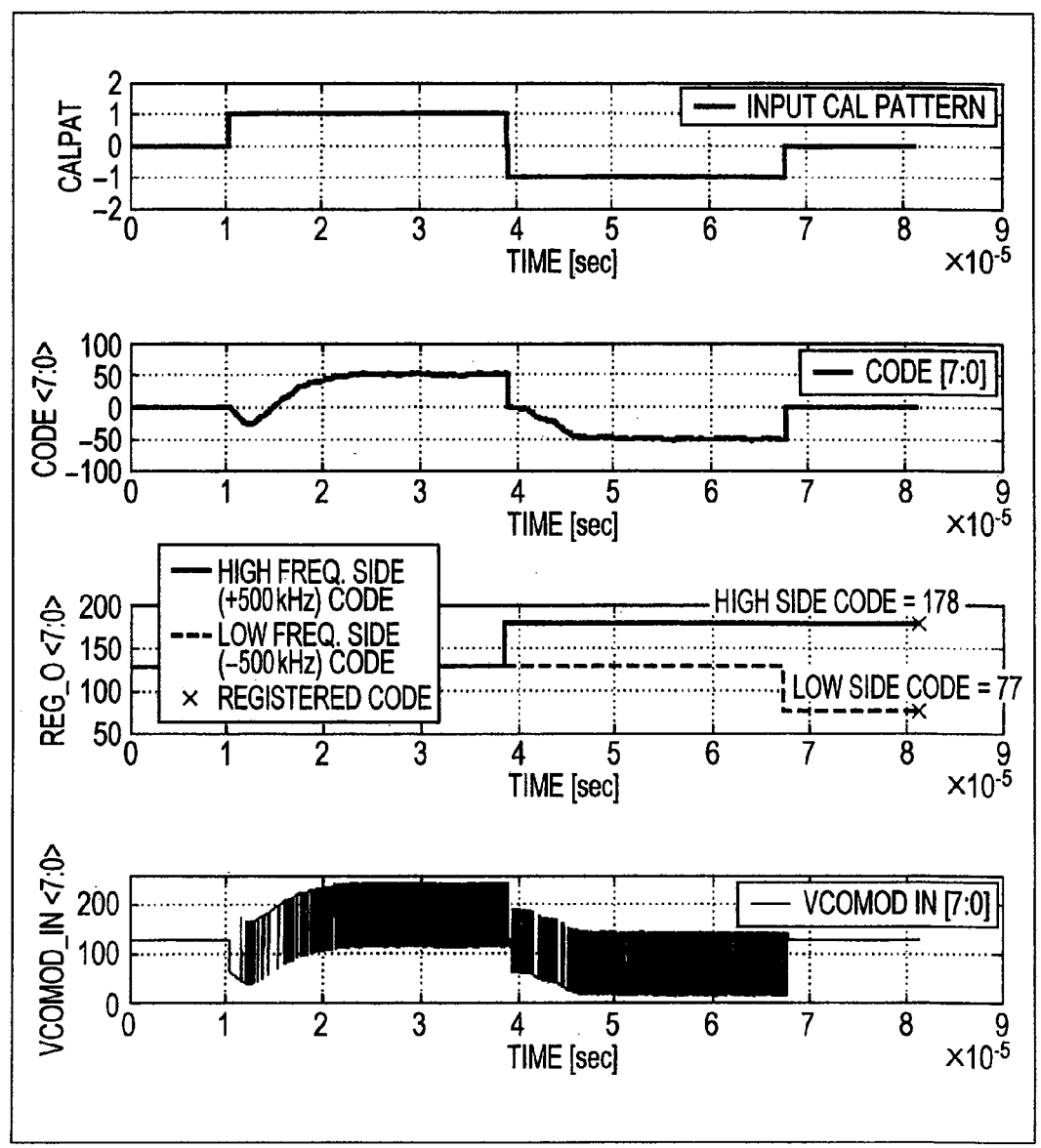
FIG. 9 is a diagram showing one example illustrative of waveforms of simulation conducted as targeted for the digital calibration circuit of FIG. 6.

FIG. 9 is a diagram showing one example illustrative of waveforms of simulation conducted as targeted for the digital calibration circuit DCALBK of FIG. 6. A calibration pattern CALPAT, a code signal (CODE<7:0>), a set signal (REG_O<7:0>) to the register REG, and a modulation set signal (VCOMOD_IN<7:0>) inputted to the oscillator circuit VCO are shown in FIG. 9. The calibration pattern CALPAT corresponds to the set value (NI) of the division ratio in FIG. 8(*a*) referred to above. The code signal CODE<7:0> corresponds to FIG. 8(*b*). In the present example, "50" is obtained as the final convergence code on the high side, and "−51" is obtained as the final convergence code on the low side. The set signal REG_O<7:0>) becomes values obtained by adding 128 to the final convergence codes on the high and low sides respectively. The so-obtained high-side code $CD_H$ (=178) and low-side code $CD_L$ (=77) are used in the modulation at the normal operation (transmission operation).

The simulation is based on the premise that a frequency resolution relative to the code is set as 10 kHz, and an error in resolution does not appear. It is understood that since the high-side code $CD_H$ corresponds to +500 kHz and the low-side code $CD_L$ corresponds to −500 kHz when conversion to a difference from a center frequency is conducted, a calibration within ±25 kHz can already be carried out. The modulation set signal VCOMOD_IN<7:0>) assumes such a waveform that a fluctuation of ±$A_{DG}$ with the multiplier MUL of FIG. 6 is added thereto, centering on the value obtained by adding 128 to the code CODE<7:0>).

<<Principal Performance of Digital Calibration Circuit>>

FIGS. 10(*a*) and 10(*b*) respectively show one example of a result of calculations of various performance, which have been performed as targeted for the digital calibration circuit DCALBK of FIG. 6, in which FIG. 10(*a*) is a table in which design values and input conditions thereof are summarized, and FIG. 10(*b*) is a table in which results of trial calculations are summarized. As shown in FIG. 10(*a*) herein, the gain ($A_{DPFD}$) of the digital phase frequency detector DPFD, the modulation sensitivity ($K_{MOD}$) of the oscillator circuit VCO, the division ratio (N) of the divider DIV, the reference clock cycle (Tref) of the crystal oscillator XTAL, and the gain ($A_{DG}$) of the multiplier MUL are defined as design values. An initial frequency ($f_1$), a post-switched frequency ($f_2$) and the tolerance (tol) of the frequency at the convergence are defined as input conditions.

As a result of trial calculations under such circumstances, a band fc: 90 kHz, a phase margin $\theta_{PM}$: 66.2°, and a settling time $T_{LOCK}$: 16.6 μs in the digital loop were obtained as shown in FIG. 10(*b*). Thus, when $A_{DG}$=64, for example, a stable calibration operation can be achieved to satisfy a phase margin of 45° or more. Further, since the settling time becomes 16.6 μs, the time required for calibration can be shortened. Incidentally, the results of trial calculations are calculated by the following equations (4) through (6). Various coefficients used in the equations (4) through (6) are defined by the following equations (7) through (9).

$$fc = \frac{1}{2\pi} \sqrt{\frac{(T_{ref}D(1/2+A_{DG}))^2 + \sqrt{(T_{ref}D(1/2+A_{DG}))^4 + 4(T_{ref}D)^2}}{2T_{ref}^2}} \quad (4)$$

$$\theta_{PM} = \tan^{-1}(T_{ref}(1/2) + A_{DG})\omega_c \cdot \left[\frac{180}{\pi}\right] \quad (5)$$

$$T_{LOCK} = \frac{-\ln\left[\frac{tol}{f_2 - f_1}\sqrt{1-\xi^2}\right]}{\xi \cdot \omega_n} \quad (6)$$

$$D = \frac{2\pi A_{DPFD} K_{MOD}}{N} \quad (7)$$

$$\xi = \frac{T_{ref}}{2}\left[\frac{1}{2} + A_{DG}\right]\omega_n \quad (8)$$

$$\omega_n = \sqrt{\frac{D}{T_{ref}}} \quad (9)$$

<<Configuration and Operation of High Frequency Signal Processing Device (its Overall)>>

Figure 11A:
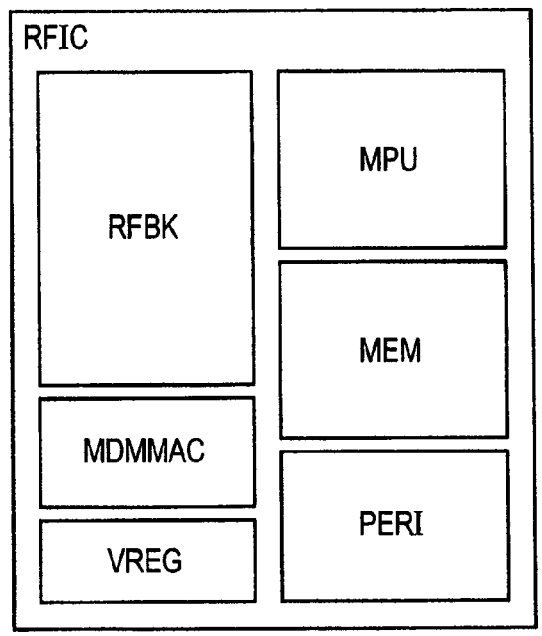

FIG. 11(*a*) is a block diagram showing one example of an overall configuration of the high frequency signal processing device according to the first embodiment of the present invention, and FIG. 11(*b*) is a circuit block diagram showing a configuration example of an RF frontend unit RFBK of FIG. 11(*a*). The high frequency signal processing device RFIC shown in FIG. 11(*a*) is configured by a single semiconductor chip, for example and serves as a processing device for Zig-Bee (registered trademark). The high frequency signal processing device RFIC includes the RF frontend unit RFBK, a digital modulation/demodulation unit MDMMAC, an internal power supply generator VREG, a microprocessor unit MPU, a memory unit MEM, and various frequency circuit units PERI. The internal power supply generator VREG supplies internal power to the various frequency circuit units. The memory unit MEM is appropriately accessed with various processing of the microprocessor unit MPU and the like. The various frequency circuit units PERI include, for example, a timer circuit, a circuit for interfacing to a remote-controlled operating mechanism, etc. The microprocessor unit MPU performs control on an operation mode for such ZigBee (registered trademark) as described in FIG. 26, control on the various frequency circuit units PERI, the output of transmission digital data to the digital modulation/demodulation unit MDMMAC, predetermined processing corresponding to reception digital data inputted from the digital modulation/demodulation unit MDMMAC, etc.

The digital modulation/demodulation unit MDMMAC performs digital modulation (e.g., code-based spreading) or the like on the transmission digital data outputted from the microprocessor unit MPU and thereafter outputs the corresponding data to the RF frontend unit RFBK as transmission data TXDAT. Further, the digital modulation/demodulation unit MDMMAC performs digital demodulation (e.g., code-based inverse spreading) or the like on the reception data RXDAT outputted from the RF frontend unit RFBK and thereafter outputs the corresponding data to the microprocessor unit MPU as reception digital data. The RF frontend unit RFBK receives the transmission data TXDAT used as a baseband signal from the digital modulation/demodulation unit MDMMAC and generates a high frequency transmission signal modulated according to the transmission data TXDAT, followed by being transmitted to an antenna. Further, the RF frontend unit RFBK inputs therein a high frequency reception signal received by the antenna and demodulates it to generate reception data RXDAT used as a baseband signal. The PLL circuit (PLL1) described in FIG. 1 and the like is applied to the RF frontend unit RFBK. Incidentally, the baseband processing circuit BB1 described in FIG. 1 and the like corresponds to the digital modulation/demodulation unit MDMMAC and the microprocessor unit MPU or the like. The calibration controller CALCTL is achieved by providing a sequencer circuit within the RF frontend unit RFBK, for example. Some functions thereof can also by achieved by MPU-based program control.

Figure 11B:
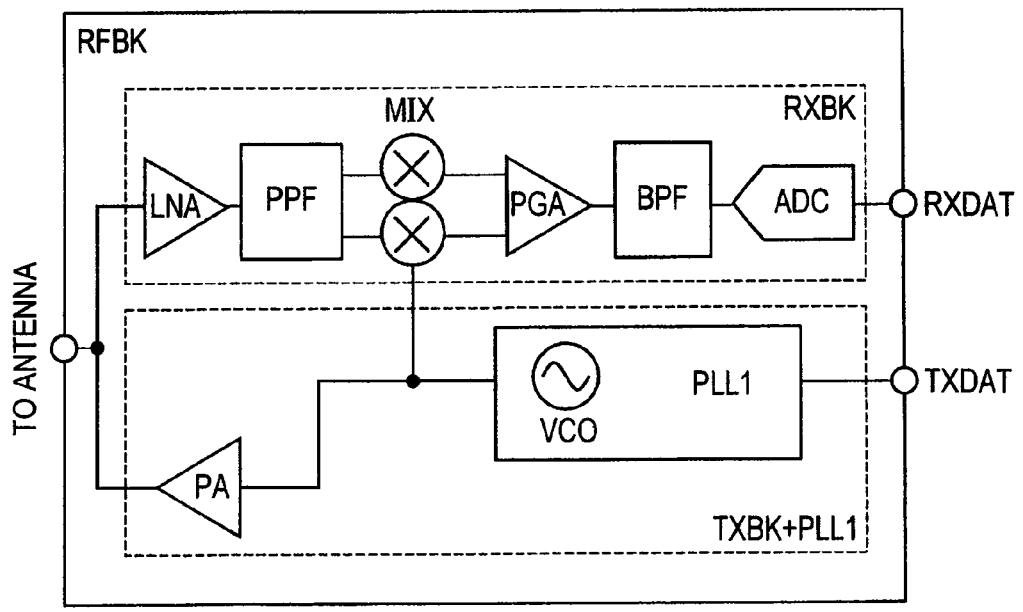

As shown in FIG. 11(b), the RF frontend unit RFBK includes a transmission block TXBK and a reception block RXBK. The transmission block TXBK includes a power amplifier PA in addition to the PLL circuit (PLL1) described in FIG. 1 and the like. As described above, the PLL circuit PLL1 generates the high frequency transmission signal modulated according to the transmission data TXDAT by controlling the oscillator circuit VCO. The power amplifier PA amplifies the corresponding high frequency transmission signal and transmits it to the antenna. The reception block RXBK includes a low noise amplifier LNA, a complex filter (polyphase filter) PPF, a mixer MIX, a programmable gain amplifier PGA, a complex bandpass filter BPF, and an analog-digital converter ADC.

The low noise amplifier LNA amplifies the high frequency reception signal received by the antenna, which in turn is inputted to the mixer MIX via the polyphase filter PPF. Here, a so-called low IF reception system is used. The mixer MIX performs IQ-quadrature conversion using a local oscillation signal for low IF generated by the PLL circuit (PLL1) in the transmission block TXBK and thereby outputs I and Q signals. Here, transmission and reception are assumed to be performed in isolation in time, and with its isolation, the PLL circuit (PLL1) in the transmission block TXBK is used in common for the transmission and reception. Since image signals are sufficiently eliminated by the polyphase filter PPF, processing can be performed aimed at only the real part, and the programmable gain amplifier PGA amplifies the I signal outputted from the mixer MIX at a predetermined gain. The output signal of the programmable gain amplifier PGA is band-limited by the complex bandpass filter BPF and thereafter inputted to the analog-digital converter ADC. The analog-digital converter ADC converts the input analog signal into a digital signal to generate reception data RXDAT.

Using the high frequency signal processing device according to the first embodiment as described above makes it possible to achieve, typically, an improvement in the accuracy of calibration, its speeding-up, a reduction in the area overhead with the calibration, etc. Accordingly, the high frequency signal processing device is applied to a wireless communication system for ZigBee (registered trademark) or the like, for example, thereby making it possible to achieve stabilization of communications (reduction in BER (Bit Error Rate)), a cost reduction in system, a reduction in system's power consumption, etc.

Second Embodiment

Another Example of Calibration Sequence

Figure 12:
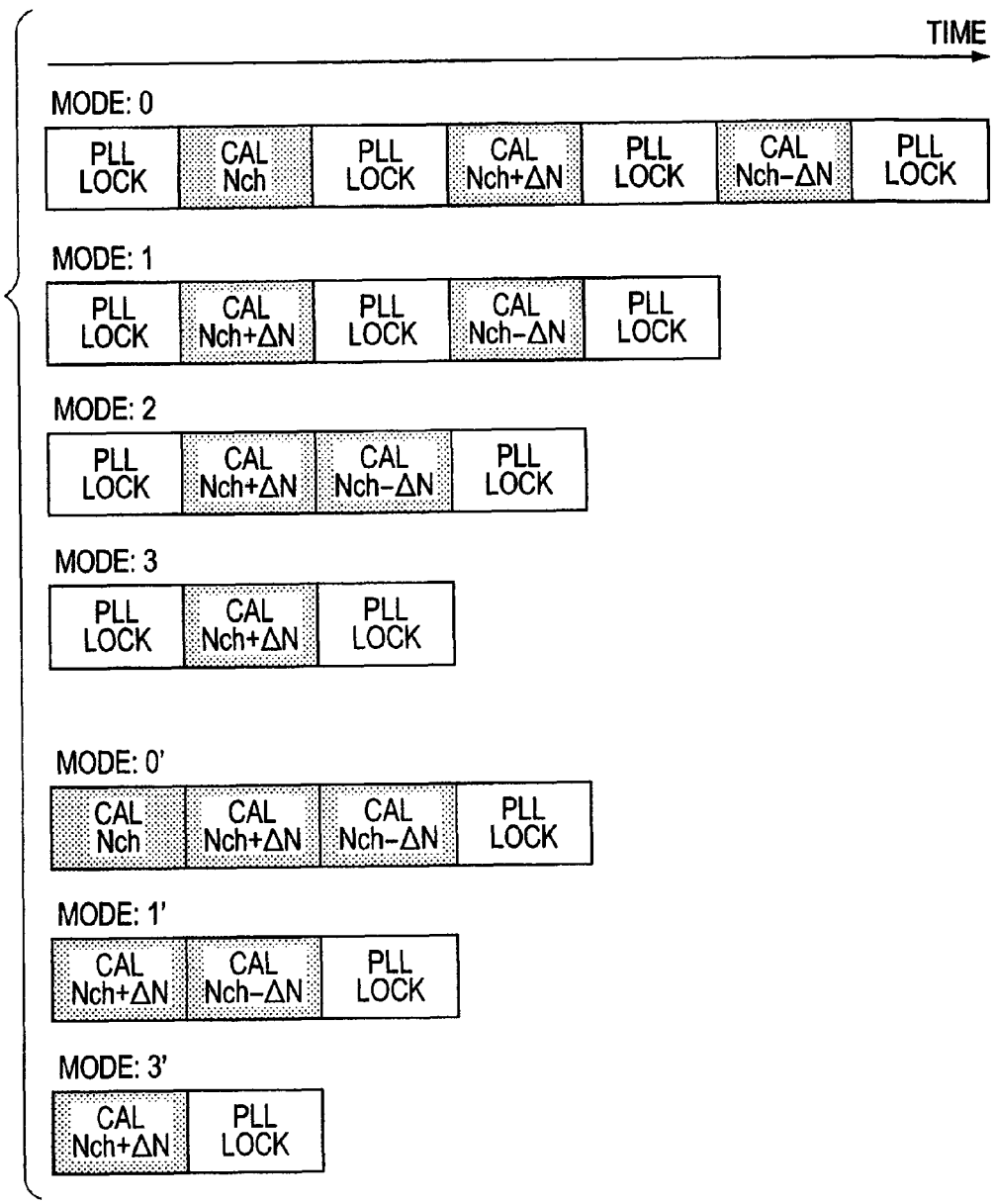
FIG. 12 is an explanatory diagram showing one example illustrative of the contents of processing of calibration sequences of a high frequency signal processing device according to a second embodiment of the present invention.

A second embodiment will explain different calibration sequences executable using the high frequency signal processing device according to the first embodiment. FIG. 12 is an explanatory diagram showing one example illustrative of the contents of processing of the calibration sequences in the high frequency signal processing device according to the second embodiment of the present invention. The high frequency signal processing device according to the second embodiment is capable of selectively executing the seven calibration sequences shown in FIG. 12, for example, using a configuration example similar to the first embodiment. Described concretely, for example, the calibration controller CALCTL shown in FIG. 1 and the like is provided with a mode setting register for selecting a calibration sequence to be executed. The calibration controller CALCTL appropriately generates various control signals (digital on signal DCAL_ON, analog on signal ALP_ON, switch control signal SWCTL and averaging on signal AVG_ON) necessary when the selected calibration sequence is executed.

Figure 13A:
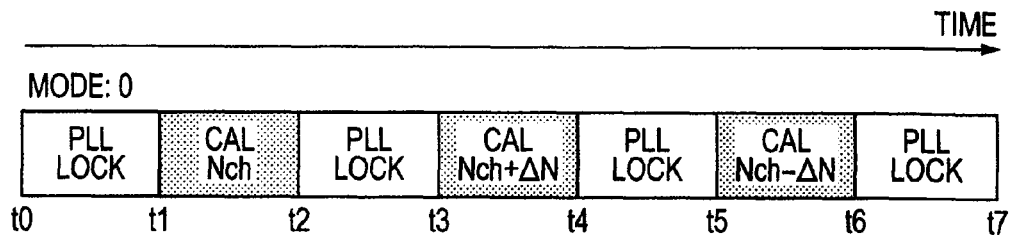
Figure 13B:
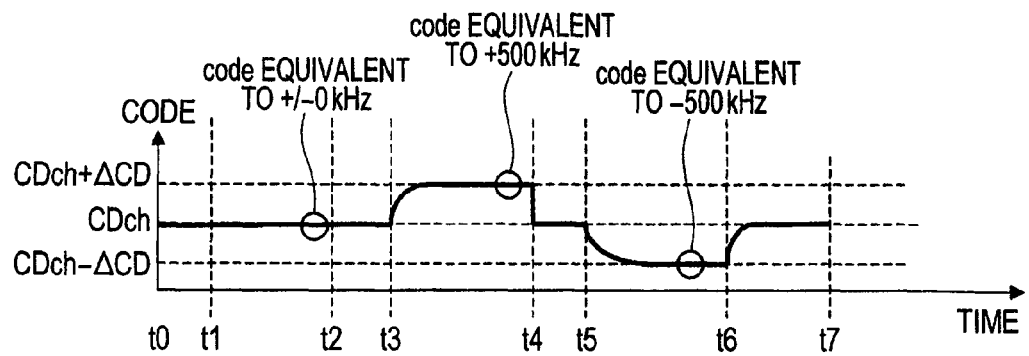

The seven types of calibration sequences comprised of modes: 0 to 3; 0'; 1'; and 3' are shown in FIG. 12. In the mode: 0 to 3, an improvement in the accuracy of calibration is obtained in mode order of 0, 1, 2 and 3. The shortening of a calibration time is obtained in mode order of 3, 2, 1 and 0 in reverse. The mode 1 corresponds to the calibration sequence described in FIG. 8 of the first embodiment. The reason why the improvement in the accuracy of calibration is obtained will now be explained using FIG. 13. FIG. 13(a) shows the mode: 0 in the calibration sequence of FIG. 12, FIG. 13(b) is an explanatory diagram showing a transition example of ideal calibration codes with execution of FIG. 13(a), and FIG. 13(c) is an explanatory diagram showing an actual transition example with respect to FIG. 13(b).

As shown in FIG. 13(a), the calibration sequence of the mode: 0 is carried out during a period from t0 to t7. During respective periods from t0 to t1, t2 to t3, t4 to t5 and t6 to t7, a lock process (PLL LOCK) of the PLL circuit is carried out. During the lock process of the PLL circuit, a calibration operation (CAL Nch) targeted for a channel frequency fc is performed during a period from t1 to t2. During a period from t3 to t4, a calibration operation (CAL Nch+ΔN) for obtaining the optimal code on the fc+Δf (fc+500 kHz herein) side is performed. During a period from t5 to t6, a calibration operation (CAL Nch−ΔN) for obtaining the optimal code on the fc−Δf (fc−500 kHz) side is performed. The lock process of the PLL circuit and the detailed contents for the periods from t3 to t4 and t5 to t6 are similar to FIG. 8 of the first embodiment.

Now assume where the value of a voltage control signal Vcnt is constant during the periods from t3 to t4 and t5 to t6. In this case, as shown in FIG. 13(b), a code signal (CDch+ΔCD) for increasing fc by +Δf (+500 kHz herein), and a code signal (CDch−ΔCD) for decreasing fc by −Δf (−500 kHz) can be obtained with high accuracy on the basis of the code signal (CODE) CDch corresponding to the channel frequency fc. During the periods from t3 to t4 and t5 to t6, however, the value of the voltage control signal Vcnt is held by bringing the input of the loop filter LF to a high impedance state. Thus, actually, as shown in FIG. 13(c), the value of the voltage control signal is likely to fluctuate due to a leak current (6 nA or the like, for example) flowing via the switch circuit SWdg (concretely transistor) in FIG. 4, for example. When the value of the voltage control signal Vcnt fluctuates, a frequency drift occurs in the oscillator circuit VCO, thus resulting in the occurrence of an error between the optimal codes for +Δf and −Δf obtained by calibration by the frequency drift. The amount of the fluctuation in the value of the voltage control signal Vcnt varies depending on process conditions (such as the threshold value of each transistor, etc.), external environments (temperature and so on), etc., and increases as the threshold value of the transistor becomes lower with microfabrication or the like.

Figure 13C:
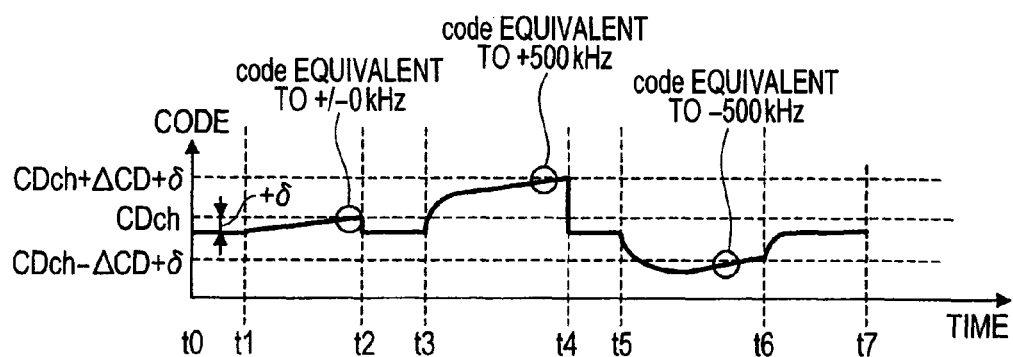

When the calibration sequence of the mode: 0 is used in such a case, it is possible to correct the error with this drift in frequency by the provision of the period from t0 to t2 as shown in FIG. 13(c). During the period from t0 to t1, the value of the voltage control signal Vcnt converges by the analog loop in a state in which the division ratio is brought to the set value (Nch) corresponding to the channel frequency fc. At t1, the analog loop is controlled to be ineffective to hold the value of the voltage control signal Vcnt. During the period from t1 to t2, the digital loop is controlled to be effective while leaving the division ratio in the state of being set to the Nch.

When the drift in frequency occurs during the period from t1 to t2, the code signal (CODE) is transitioned from CDch to CDch+δ with the digital loop. Then when the period from t1 to t2, the period from t3 to t4, and the period from t5 to t6 are all equal to one another, a fluctuation (+δ) having occurred during the period from t1 to t2 is estimated to occur even in the period from t3 to t4 and the period from t5 to t6 respectively. Thus, this fluctuation (+δ) is subtracted from the CODEs obtained during the period from t3 to t4 and the period from t5 to t6 respectively, thereby making it possible to obtain high-accurate codes in which errors with frequency drifts are corrected.

In FIG. 12, the calibration sequence of the mode: 1 is similar to the sequence described in FIG. 8 of the first embodiment and corresponds to a sequence in which the period ("PLL LOCK" and "CAL Nch") from t0 to t2 is deleted with respect to the mode: 0. When, for example, the frequency drift during the period of "CAL Nch+ΔN" or the period of "CAL Nch−ΔN" becomes almost trivial, the corresponding mode becomes beneficial because the speeding up of the calibration can be achieved as compared with the mode: 0. The calibration sequence of the mode: 2 corresponds to a sequence in which "PLL LOCK" between "CAL Nch+ΔN" and "CAL Nch−ΔN" is deleted with respect to the mode: 1. Since "CAL Nch+ΔN" and "CAL Nch−ΔN" are performed continuously, the corresponding mode becomes beneficial because further speeding-up is achieved as compared with the mode: 1, where the frequency drift is hard to occur over a relatively long period.

The calibration sequence of the mode: 3 corresponds to a sequence in which "CAL Nch−ΔN" and its subsequent "PLL LOCK" are deleted with respect to the mode: 1. In the corresponding mode, a code on the −Δf side is defined as an estimated value from a code obtained by "CAL Nch+ΔN" corresponding to the +Δf side. When the relationship between the code and capacitance value at the capacitor bank CBK is highly accurately held in a linear state, the corresponding mode becomes beneficial because further speeding-up is achieved as compared with the mode: 2. The calibration sequences of the modes: 0', 1' and 3' respectively correspond to sequences in which "PLL LOCK" excluding the final "PLL LOCK" is deleted with respect to the modes: 0, 1, 2 and 3. Since the lock process of the PLL circuit is not performed in the modes: 0', 1' and 3', the accuracy of calibration is degraded, but speeding-up can be achieved as compared with the modes: 0 to 3. When the high frequency signal processing device is applied to the ZigBee (registered trademark) system having such an internal state as described in FIG. 26, for example, the final "PLL LOCK" in the respective modes referred to above is required during a warm-up period, but can be omitted during a wake-up period.

FIG. 14 is a diagram showing one example illustrative of rough times required in the respective modes of the calibration sequences of FIG. 12. FIG. 14 shows the times required in the modes: 0 to 3 in FIG. 12. In a sequence ABS in FIG. 14, an auto band select process is performed and the setting (selection of switch circuit SWb) of the frequency range at the oscillator circuit VCO is carried out as described in FIG. 2. In a sequence PLL_L, the lock process of the PLL circuit is performed. In a sequence CAL_W, a process up to the settling using the digital loop is performed. In a sequence CAL_A, an averaging process subsequent to the settling using the digital loop is performed. In a sequence PAON, the start-up of the power amplifier is carried out, and in a sequence TXDATA, the start process of transmission data TXDAT is performed.

Here, 73 μs in total is required during periods other than the pure calibration, comprised of the sequences ABS, PAON, TXDATA and the sequence PLL_L lying immediately before the sequence PAON. When the warm-up period (144 μs) of FIG. 26 is taken as a target, for example, the time allocated to the pure calibration becomes 71 μs. The pure calibration time is given as 114 μs, 76 μs, 66 μs and 38 μs in the modes: 0, 1, 2 and 3, respectively. In this case, there is a need to use the mode: 2 or 3 for the purpose of assuredly completing the calibration within the warm-up period (144 μs). However, FIG. 14 is shown only as values for approximation. In some cases, the mode: 1 or the like may be used.

By using the high frequency signal processing device according to the second embodiment, as described above, the optimal calibration sequence can be selected from the viewpoint of the accuracy of calibration and the calibration time in addition to the various advantageous effects described in the first embodiment and further according to various conditions. It is possible to provide the calibration with flexibility upon execution of the calibration. That is, the optimization of the calibration sequence can be achieved according to the specs (such as the required accuracy and time) and environment (temperature, for example) of the system to which the high frequency signal processing device is applied, or manufacturing process conditions of the high frequency signal processing device itself. Incidentally, although the seven types of calibration sequences are shown by way of example in FIG. 12, it is needless to say that the calibration sequence is not limited to these. It is also possible to further provide a calibration sequence in which these are combined appropriately. It is also possible to provide a calibration sequence for executing or running up to "CAL Nch+ΔN" in the mode: 0 and define a code on the −Δf side as an estimated value as with the mode: 3.

Third Embodiment

Detailed Circuit Around Capacitor Bank

Figure 15:
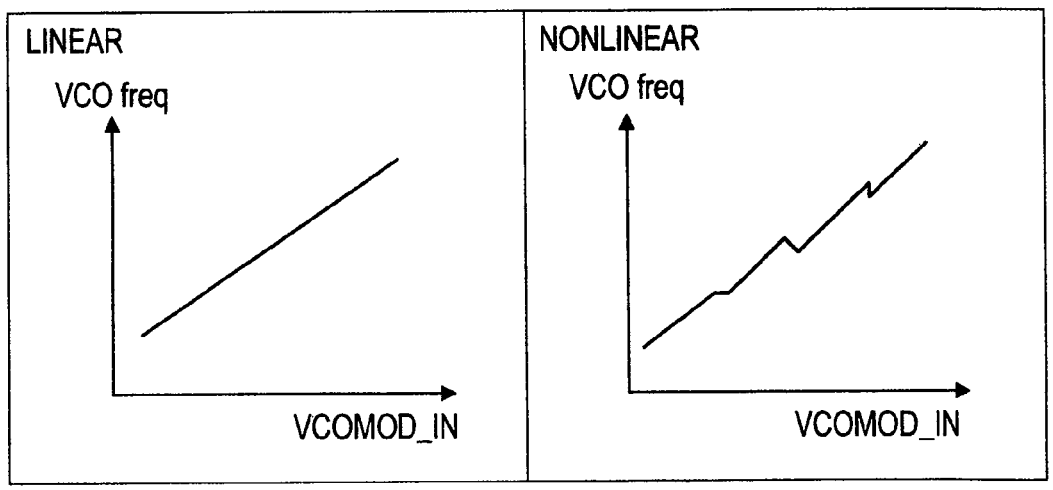
FIG. 15 is an explanatory diagram showing one example illustrative of characteristics of a capacitor bank discussed as a premise of a high frequency signal processing device according to a third embodiment of the present invention.

A third embodiment will explain the details of the periphery of the capacitor bank described in FIG. 1 and the like of the first embodiment. FIG. 15 is an explanatory diagram showing one example illustrative of characteristics of a capacitor bank discussed as a premise of a high frequency signal processing device according to the third embodiment of the present invention. By carrying out such calibration as described in the first and second embodiments as mentioned above, high-accuracy modulation can be performed by the capacitor bank CBK and the accuracy thereof can principally be determined by the resolution frequency of the capacitor bank CBK. In this case, as shown in FIG. 15, a problem arises where the frequency characteristic of the oscillator circuit VCO relative to the modulation set signal VCOMOD_IN at the capacitor bank CBK is not held in a linear state (resolution frequency is not constant), but held in a non-linear state (resolution frequency has fluctuations). That is, when the convergence value of VCOMOD_IN by the calibration corresponds to each steplike portion in FIG. 15, for example, degradation in the calibration accuracy occurs. When the calibration sequence of the mode: 3 described in FIG. 12 of the second embodiment is used, for example, a large error occurs in the estimated value of the code on the −Δf side. The third embodiment will therefore explain the capacitor bank CBK capable of improving the linearity for the frequency setting.

Figure 16:
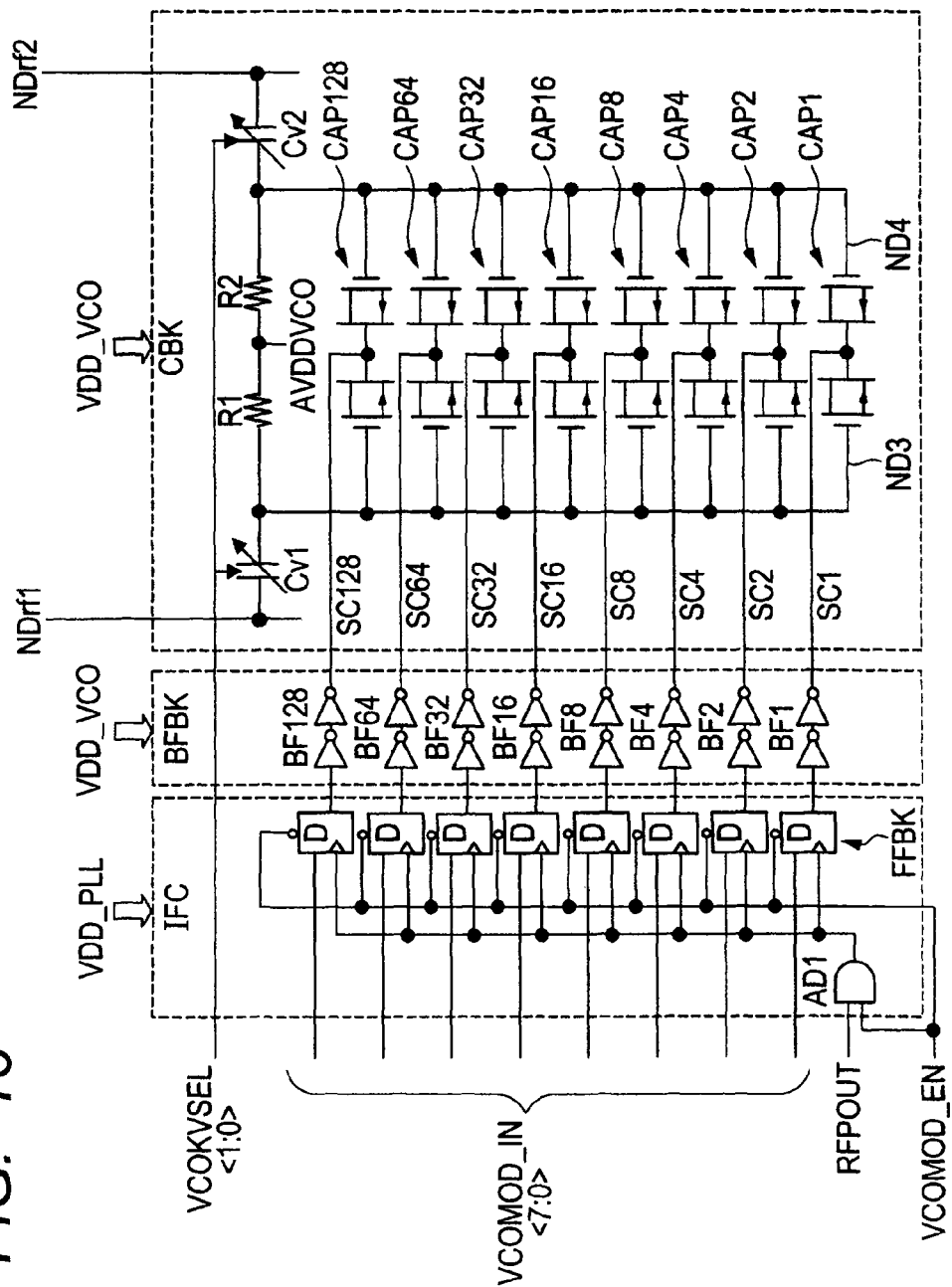
FIG. 16 is a circuit diagram illustrating a detailed configuration example of a periphery of a capacitor bank of FIG. 1 in the high frequency signal processing device according to the third embodiment of the present invention.

FIG. 16 is a circuit diagram illustrating a detailed configuration example of the periphery of the capacitor bank of FIG. 1 in the high frequency signal processing device according to the third embodiment of the present invention. The capacitor bank CBK, interface circuit IFC inputted with the modulation set signal (VCOMOD_IN<7:0>) directed to the capacitor bank CBK, and buffer circuit block BFBK which transmits the output of the interface circuit IFC to the capacitor bank CBK are shown in FIG. 16. The capacitor bank CBK includes a plurality (eight herein) of capacitor pairs CAP1, 2, 4, 8, 16, 32, 64 and 128, resistors R1 and R2, and varactor capacitors Cv1 and Cv2. The buffer circuit block BFBK includes a plurality (eight herein) of buffer circuits BF1, 2, 4, 8, 16, 32, 64 and 128.

The capacitor pair CAP1 is achieved by two NMOS transistors herein. A gate of one thereof is coupled to a node ND3, a gate of the other thereof is coupled to a node ND4, and source and drains of the two are coupled in common to a control line SC1. Backgates of the two NMOS transistors are coupled to a ground power supply voltage GND or their corresponding sources if an increase in area is allowed. In a manner similar to the CAP1, the CAP2, 4, 8, 16, 32, 64 and 128 are also achieved by two MOS transistors respectively. A gate of one thereof is coupled to the node ND3, and a gate of the other thereof is coupled in common to the node ND4. Sources (drains) of the two MOS transistors are respectively coupled to control lines SC2, 4, 8, 16, 32, 64 and 128 every CAP2, 4, 8, 16, 32, 64 and 128.

The resistors R1 and R2 have one ends to which a fixed voltage (AVDDVCO) is applied in common. The other end of the resistor R1 is coupled to the node ND3, and the other end of the resistor R2 is coupled to the node ND4. The resistors R1 and R2 suppress the transmission of a high frequency signal and supplies the fixed voltage AVDDVCO to the nodes ND3 and ND4. The varactor capacitor Cv1 is coupled between the node ND3 and an oscillation output node NDrf1, and the varactor capacitor Cv2 is coupled between the node ND4 and an oscillation output node NDrf2. The varactor capacitors Cv1 and Cv2 can take four-stage capacitance settings according to a set signal (VCOKVSEL<1:0>). The buffer circuits BF1, 2, 4, 8, 16, 32, 64 and 128 do output to the control lines SC1, 2, 4, 8, 16, 32, 64 and 128 respectively in response to inputs given from the interface IFC.

The interface circuit IFC includes a flip-flop circuit block FFBK and an AND arithmetic circuit AD1. The flip-flop circuit block FFBK latches the modulation set signal (VCOMOD_IN<7:0>) by a plurality (eight herein) of flip-flop circuits. The flip-flop circuits respectively do latch output to the buffer circuits BF1, 2, 4, 8, 16, 32, 64 and 128. The AND arithmetic circuit AD1 has two inputs whose one is inputted with a modulation enable signal (VCOMOD_EN), and supplies an oscillation signal RFPOUT to the flip-flop circuit block FFBK as a clock signal for latch where the corresponding signal is in an active state. The oscillation signal REPOUT corresponds to a signal outputted from the divider DIV as shown in FIG. 6. The modulation enable signal VCOMOD_EN is brought to an inactive state in a reception mode, for example. Each of the flip-flop circuits of the flip-flop circuit block FFBK is reset in response to the inactive state of the modulation enable signal VCOMOD_EN.

In such a configuration, the capacitance values (concretely transistor sizes) of the above-described capacitor pairs CAP2, 4, 8, 16, 32, 64 and 128 become 2 times, 4 times, 8 times, 16 times, 32 times, 64 times and 128 times respectively with the capacitance value of the CAP1 as a reference (1 time). Thus, capacitance settings of 256 steps are enabled by controlling the effectiveness/ineffectiveness of the capacitor pairs CAP by the control lines SC1 through SC128 (modulation set signal VCOMOD_IN) respectively. The varactor capacitors Cv1 and Cv2 are provided to adjust or reduce resolution widths (Hz/Step) for the capacitance settings. That is, since the varactor capacitors Cv1 and Cv2 are coupled in series with the capacitor pairs CAP1 through CAP128, the capacitance values of the capacitor pairs CAP1 through CAP128 become small apparently due to their combined capacity and hence an improvement in resolution can be achieved. Since the capacitance values of the varactor capacitors Cv1 and Cv2 can be set in plural stages, the capacitance values can be corrected where, for example, the capacitance values of the capacitor pairs CAP1 through CAP128 deviate from the design values due to variations in manufacture.

Further, here, the buffer circuits BF1 through BF128 are also weighted in a manner similar to the capacitor pairs CAP1 through CAP128. The output capacitance values (concretely, the sizes of output transistors directed to control lines SC) of the buffer circuits BF2, 4, 8, 16, 32, 64 and 128 assume 2, 4, 8, 16, 32, 64 and 128 times respectively with the capacitance value of the buffer circuit BF1 as a reference (1 time). When, for example, the voltage levels of the control lines SC1, 2, . . . , and 64 are all '0' and the voltage level of the control line SC128 is '1' due to the modulation set signal VCOMOD_IN, the output capacitance values of the buffer circuits BF1, 2, . . . , and 64 affect the value of a resonant frequency as parasitic capacitance components. Thereafter, since the voltage levels of the control lines SC1, 2, . . . , and 64 become all '1' and the voltage level of the control line SC128 becomes '0' at the next step, the output capacitance value of the buffer circuit BF128 affects the value of the resonant frequency as a parasitic capacitance component.

Now, if the output capacitance values of the buffer circuits BF are all identical to each other (Cout), the parasitic capacitance components vary from 7Cout to 1Cout with the above step transition, thereby causing non-linearity of each frequency setting. On the other hand, when weights are assigned to the buffer circuits BF1 through BF128, the output capacitance values vary from 127Cout to 128Cout with the output capacitance value of the buffer circuit BF1 as Cout in the example of the step transition. It is thus possible to improve linearity of the frequency setting. Incidentally, in FIG. 16, the interface circuit IFC is supplied with a power supply voltage VDD_PLL, and the buffer circuit block BFBK and the capacitor bank CBK are respectively supplied with a power supply voltage VDD_VCO. The different power supply voltages are used in this way to prevent a higher harmonic of a clock signal such as 16 MHz or the like from affecting the oscillation frequency of the oscillator circuit VCO via a power supply line since the flip-flop circuit block FFBK in the interface circuit IFC is operated at the clock signal.

Figure 17A:
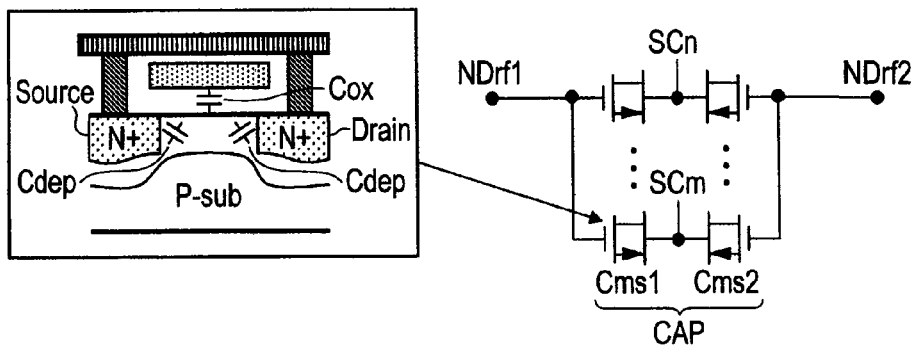
FIGS. 17(a) through 17(c) are conceptual diagrams showing one example illustrative of capacitance variable systems respectively different from one another in the capacitor bank of FIG. 1 in the high frequency signal processing device according to the third embodiment of the present invention.
Figure 17B:
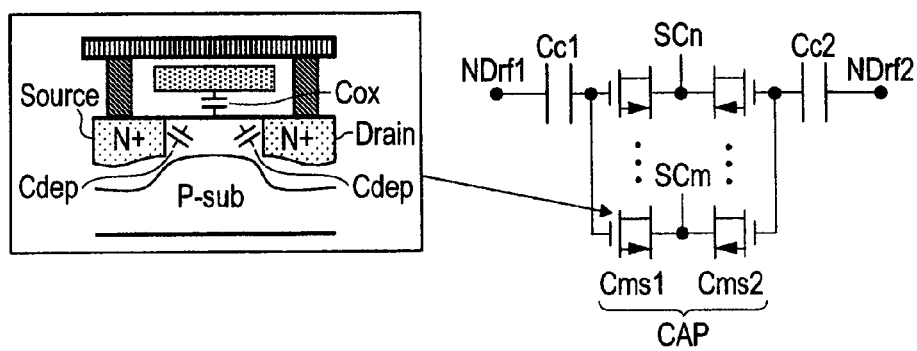
Figure 17C:
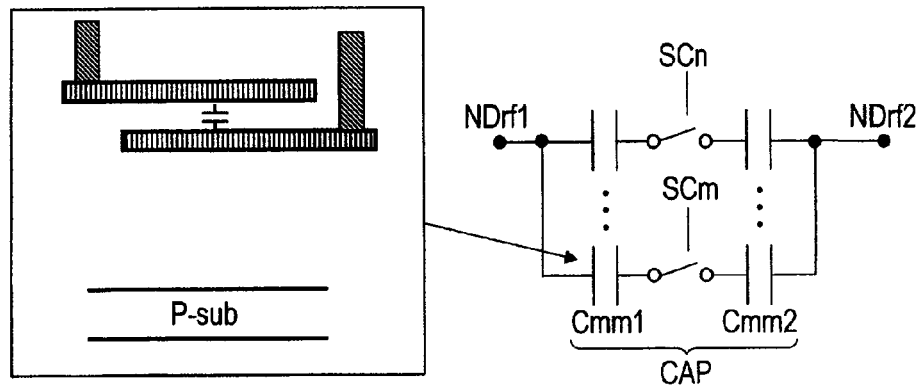

FIGS. 17(a) through 17(c) are conceptual diagrams showing one example illustrative of capacitance variable systems respectively different from one another in the capacitor bank CBK of FIG. 1 in the high frequency signal processing device according to the third embodiment of the present invention. In FIG. 16, the MOS capacitors (capacitor pairs CAP1 through CAP128) are selected by the control lines SC1 through SC128 respectively, and switching between the capacitance values is done by combining the selected one with the varactor capacitors Cv1 and Cv2. This is of course not limited to it, but may be achieved by other systems. In such a system as shown in FIG. 17(a), for example, capacitor pairs CAP each comprised of two MOS capacitors Cms1 and Cms2 are appropriately selected by their corresponding control lines SC to thereby perform switching between capacitance values. The corresponding system becomes useful where, for example, such a manufacturing process that the capacitance value of each MOS capacitor can be reduced, and variations in the capacitance value thereof can also be reduced, is used.

In such a system as shown in FIG. 17(b), as with the system of FIG. 16, capacitor pairs CAP each comprised of two MOS capacitors Cms1 and Cms2 are appropriately selected by their corresponding control lines SC (SCn, ..., SCm), and switching between capacitance values is done by coupling fixed capacitors Cc1 and Cc2 (corresponding to the varactor capacitors Cv1 and Cv2 in FIG. 16) in series with the selected one. In such a system as shown in FIG. 17(c), capacitor pairs CAP each comprised of two MIM (Metal Insulator Metal) capacitors Cmm1 and Cmm2 instead of the two MOS capacitors Cms1 and Cms2 shown in FIG. 17(a) are used and appropriately selected by their corresponding control lines SC (one ends thereof are coupled in common via MOS switches or the like), whereby switching between capacitance values is conducted. Although the corresponding system may cause a slight increase in area as compared with the system of FIG. 17(a), it is possible to relatively achieve an improvement in accuracy because, for example, bias dependence of each capacitance value and the like do not occur.

<<Layout of Capacitor Bank>>

Figure 18A:
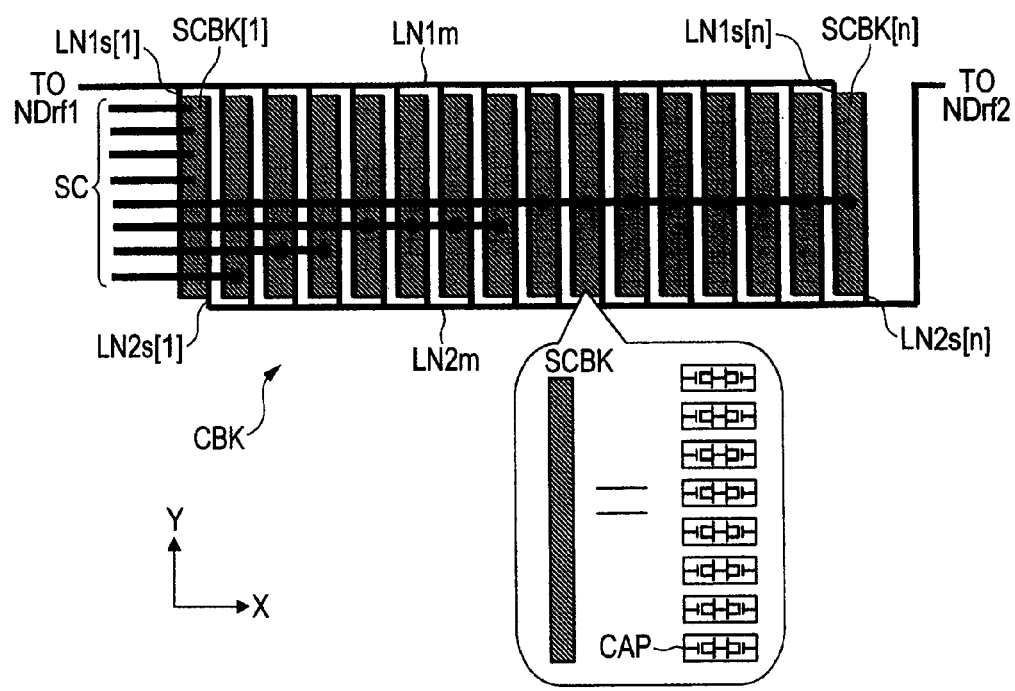
Figure 18B:
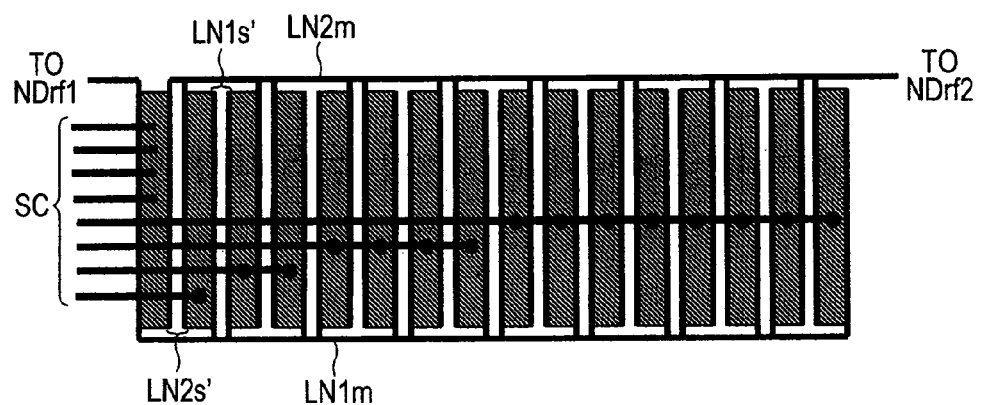

FIG. 18(a) is a schematic diagram showing a layout configuration example of a part of the capacitor bank CBK of FIG. 16, and FIG. 18(b) is a schematic diagram showing a layout configuration example taken as a target for comparison of FIG. 18(a). The capacitor bank CBK shown in FIG. 18(a) includes wirings LN1m and LN2m, n branch wirings LN1s[1] through [n] and LN2s[1] through [n], n sub capacitor banks SCBK[1] through [n], and a plurality of control lines SC. The wiring LN1m extends in an +X direction from the oscillation output node NDrf1 side. The branch wirings LN1s[1] through [n] are respectively displaced at equal intervals and extend in a −Y direction so as to branch from the wiring LN1m. The wiring LN2m is disposed parallel with the LN1m and extends in an −X direction from the oscillation output node NDrf2 side. The branch wirings LN2s[1] through [n] respectively extend in a +Y direction so as to branch from the wiring LN2m and are disposed one by one between the branch wirings LN1s adjacent to each other. That is, the wirings extending from the oscillation output node NDrf1 and the wirings extending from the oscillation output node NDrf2 are formed in a comb-teeth shape.

The sub capacitor bank SCBK[k] (where k=1 to n) includes a plurality of capacitor pairs CAP disposed between the branch wirings LN1s[k] and LN2s[k] and having one ends parallel-coupled to the branch wiring LN1s[k] and the other ends parallel-coupled to the branch wiring LN2s[k]. A plurality of control lines SC extend in the +X direction toward their corresponding sub capacitor banks SCBK and have leading ends coupled to common coupling nodes of the capacitor pairs CAP in the sub capacitor banks SCBK. Here, the sizes of the capacitor pairs CAP in the sub capacitor banks SCBK[1] through [n] are all set identical to one another, and the above weighting is performed by changing the number of the capacitor pairs CAP coupled to the control lines SC. For example, the sixteen sub capacitor banks SCBK[1] through [16] are provided and the control line (corresponding to the SC128 of FIG. 16) to which the largest weighting is given is coupled to the eight sub capacitor banks. Further, the control line (corresponding to the SC64 of FIG. 16) to which secondly-large weighting is given is coupled to the four sub capacitor banks.

With the use of such a layout configuration example, firstly, the points where the wirings (LN1m and LN1s) on the NDrf1 side and the wirings (LN2m and LN2s) on the NDrf2 side, and the control lines SC run parallel to one another in close vicinity to one another are reduced because the branch wirings and the control wirings are different in their extending directions, thus making it possible to reduce an error (change) in frequency resolution with coupling. Secondly, a symmetric layout can be achieved between the wirings (LN1m and LN1s) on the NDrf1 side and the wirings (LN2m and LN2s) on the NDrf2 side, thereby making it possible to make differential balance with parasitic capacitance or the like uniform. This enables an improvement in the linearity of each frequency setting.

On the other hand, in the layout configuration example shown in FIG. 18(b) as a comparative example, branch wirings LN1s' extending so as to branch from a wiring LN1m are disposed at equal intervals with two as a unit. Branch wirings LN2s' extending so as to branch from a wiring LN2m are also disposed at equal intervals with two as a unit. That is, the wirings extending from the NDrf1 and the wirings extending from NDrf2 are formed in a comb-teeth shape with the two as the unit. However, the branch wirings located at both ends are provided as a single unit. When such a configuration example is used, the differential balance is likely to be ununiform, thus leading to the occurrence of non linearity of the frequency setting. It is thus desirable to use such a layout configuration example as shown in FIG. 18(a). Incidentally, the layout configuration example of FIG. 18(a) is not, of course, limited to it, but can be modified as appropriate within the scope not departing from the above-described gist. For example, the control lines (each corresponding to the control line SC128 of FIG. 16) subjected to the largest weighting are coupled to the eight sub capacitor banks on alternate control lines, or the sequence of placement of the control lines may also be altered as appropriate.

Figure 19:
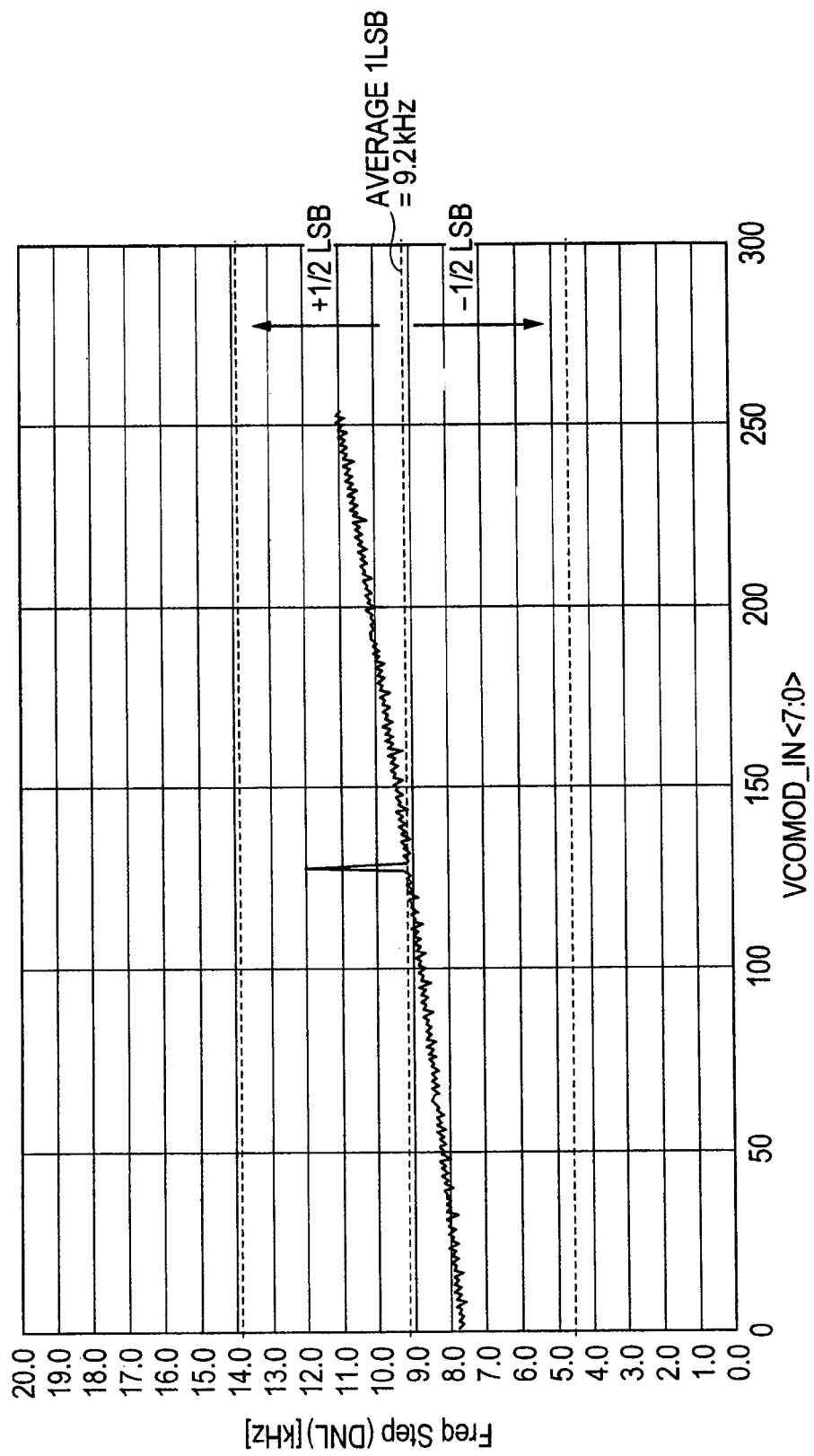
FIG. 19 is a diagram showing a result obtained by verifying linearity of the capacitor bank having each of the configuration examples of FIG. 16 and FIG. 18(a) by actual load simulation with being targeted for the capacitor bank.

FIG. 19 is a diagram showing a result obtained by verifying linearity of the capacitor bank having each of the configuration examples of FIG. 16 and FIG. 18(a) by actual load simulation with being targeted for the capacitor bank. In FIG. 19, the horizontal axis indicates a modulation set signal VCOMOD_IN, and the vertical axis indicates the amount of variation in frequency where the value of each VCOMOD_IN is transitioned by +1 step with the value thereof as a base point. Here, a design value is taken as 9.2 kHz/step, and so-called DNL (Differential Nonlinearity) is evaluated with the design value as the reference. As an index for evaluating linearity, DNL is generally required to be placed within ±LSB/2 (1LSB=9.2 kHz in this example). It is possible to sufficiently meet the corresponding condition by using the high frequency signal processing device according to the third embodiment as shown in FIG. 19.

Using the high frequency signal processing device according to the third embodiment as mentioned above enables typically an improvement in linearity of each frequency setting using the varactor capacitors and makes it possible to achieve an improvement in the accuracy of the frequency setting. Accordingly, a further improvement in the accuracy of calibration can be achieved by combining the high frequency signal processing devices according to the first and second embodiments.

Fourth Embodiment

Layout of Oscillator Circuit

A fourth embodiment will explain the layout of the oscillator circuit VCO described in FIGS. 1 and 2 and the like of the first embodiment. As mentioned above, the oscillator circuit VCO includes the capacitor bank CBK for modulation. The capacitor bank CBK is likely to cause parasitic oscillation depending on layout conditions because it is comprised of capacitive elements small in capacitance value. FIG. 20(a) is a typical diagram showing a layout configuration example of the oscillator circuit VCO of FIG. 1 in the high frequency signal processing device according to the fourth embodiment of the present invention, and FIG. 20(b) is a typical diagram showing a layout configuration example targeted for comparison thereof.

In the layout shown in FIG. 20(b), an inductor L1, a variable capacitor (varactor capacitor) Cvr, a frequency range setting circuit VCOCAP, a capacitor bank CBK, a PMOS cross-coupled circuit PMOSCC, and an NMOS cross-coupled circuit NMOSCC are disposed in order in a −Y direction. Referring to FIG. 1, the frequency range setting circuit VCOCAP corresponds to the capacitors C1 and C2 and the switch circuit SWb. The PMOS cross-coupled circuit PMOSCC corresponds to the PMOS transistors MP1 and MP2, and the NMOS cross-coupled circuit NMOSCC corresponds to the NMOS transistors MN1 and MN2. These circuits are intercoupled to each other by two wirings (NDrf1 and NDrf2) extending in the −Y direction. When such a layout is used, parasitic oscillation is likely to occur because the length of each wiring between the PMOS cross-coupled circuit PMOSCC and the capacitor bank CBK becomes shorter than that of each wiring between the PMOS cross-coupled circuit PMOSCC and the inductor L1 with the PMOS cross-coupled circuit PMOSCC as the reference.

Described concretely, a parasitic inductor Lp1 and a parasitic resistor Rp1 exist in each of the wirings (NDrf1 and NDrf2) between the PMOS cross-coupled circuit PMOSCC and the capacitor bank CBK. A parasitic inductor Lp2 and a parasitic resistor Rp2 exist in each of the wirings (NDrf1 and NDrf2) between the PMOS cross-coupled circuit PMOSCC and the inductor L1. Here, a Q value $(Q=(1/R)\times\sqrt{(L/C)})$ is known as an index indicative of the stability (ease of oscillation) of oscillation. Since the resistance value of Rp1 becomes smaller than the resistance value of Rp2 with the wiring length, relatively, the Q value between the PMOS cross-coupled circuit PMOSCC and the capacitor bank CBK becomes high, and the Q value between the PMOS cross-coupled circuit PMOSCC and the indictor L1 becomes low. Since the capacitor bank CBK is comprised of the small capacitive elements, the Q value between the PMOS cross-coupled circuit PMOSCC and the capacitor bank CBK rises even by its provision. As a result, there is a fear that parasitic oscillation might occur due to the capacitive elements of the capacitor bank CBK and the parasitic inductor Lp1.

Thus, in the layout shown in FIG. 20(a), an inductor L1, a PMOS cross-coupled circuit PMOSCC, a variable capacitor (varactor capacitor) Cvr, a frequency range setting circuit VCOCAP, an NMOS cross-coupled circuit NMOSCC, and a capacitor bank CBK are disposed in order in a −Y direction. These circuits are intercoupled to one another by two wirings (NDrf1 and NDrf2) extending in the −Y direction. When such a layout is used, parasitic oscillation is hard to occur and an improvement in reliability is achieved, because the length of each wiring between the PMOS cross-coupled circuit PMOSCC and the capacitor bank CBK becomes longer than that of each wiring between the PMOS cross-coupled circuit PMOSCC and the inductor L1 with the PMOS cross-coupled circuit PMOSCC as the reference.

Figure 21:
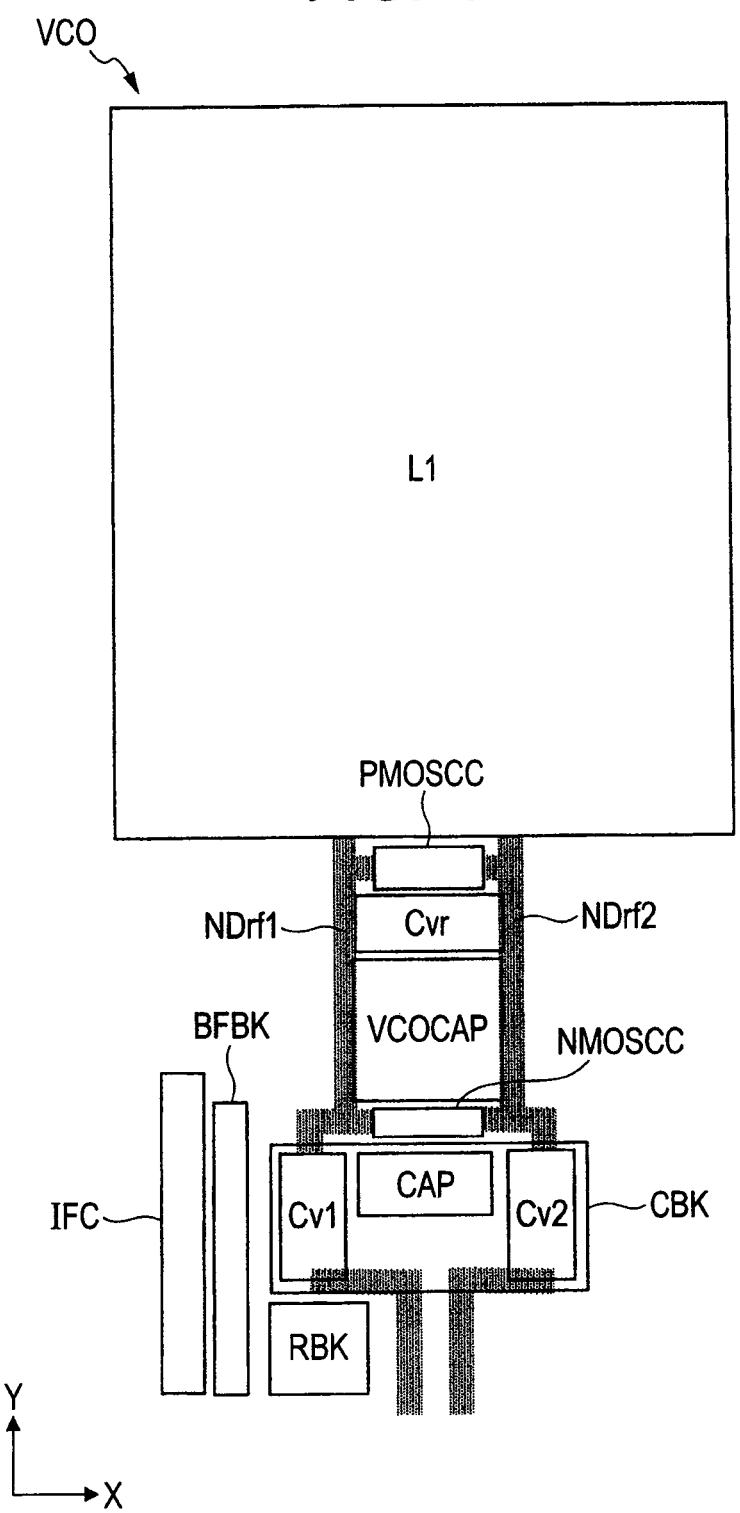
FIG. 21 is a diagram showing a more concrete layout configuration example of the oscillator circuit of FIG. 20(a)
Figure 22A:
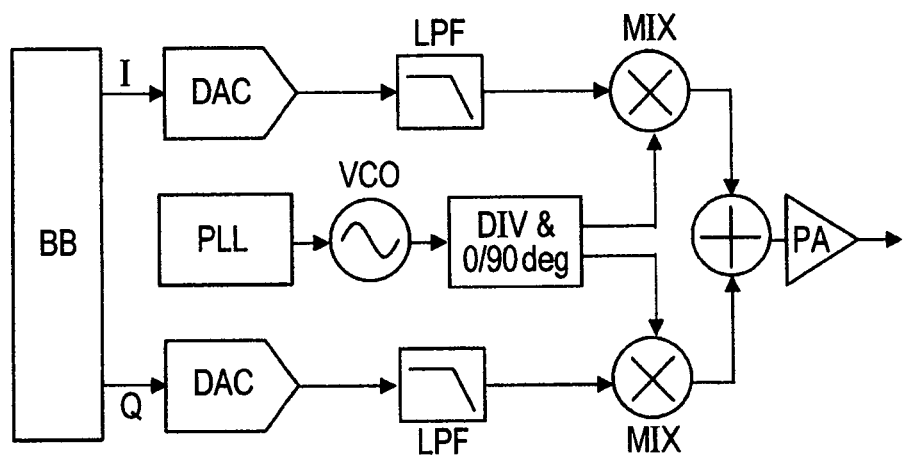
FIGS. 22(a) and 22(b) are schematic diagrams showing different configuration examples illustrative of a transmission system circuit in a high frequency signal processing circuit discussed as a premise of the present invention.
Figure 22B:
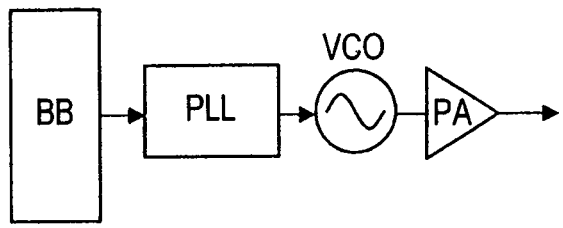

FIG. 21 is a diagram showing a more concrete layout configuration example of the oscillator circuit VCO of FIG. 20(a). In the layout shown in FIG. 21, as described in FIG. 20(a), the inductor L1, PMOS cross-coupled circuit PMOSCC, variable capacitor (varactor capacitor) Cvr, frequency range setting circuit VCOCAP, NMOS cross-coupled circuit NMOSCC, and capacitor bank CBK are disposed in order in the −Y direction. Further, the interface circuit IFC and buffer circuit block BFBK described in FIG. 16 are disposed adjacent to each other in the −X direction with the capacitor bank CBK as the reference. In addition, a resistor block RBK is disposed adjacent to the capacitor bank CBK in the −Y direction with the capacitor bank CBK as the reference and adjacent to the buffer circuit block BFBK in the +X direction with the buffer circuit block BFBK as the reference. In the capacitor bank CBK, a capacitor pair CAP is centrally disposed in the X direction, and varactor capacitors Cv1 and Cv2 are disposed on both sides.

The resistor block RBK is formed with a plurality of resistive elements at a few kHz or the like, for example. Although not shown in FIG. 16, the resistive elements are inserted in series into the outputs of the buffer circuits BF1 through BF128. Although the output of the buffer circuit block BFBK is coupled to its corresponding CAP in the capacitor bank CBK via the control line SC as is understood from FIG. 16, there is a possibility that the accuracy of each frequency setting will be degraded when coupling is made between the control line SC and the wirings (NDrf1 and NDrf2) for the oscillation output nodes. Thus, in the present example, the output of the buffer circuit block BFBK is coupled to the capacitor pair CAP via the resistor block RBK to thereby suppress the occurrence of this coupling.

Using the high frequency signal processing device according to the fourth embodiment of the present invention as described above enables, typically, stabilization of the operation of the oscillator circuit including the modulation capacitor block and an improvement in the accuracy thereof in the oscillator circuit. Thus, a highly accurate modulation operation can be achieved by combining the high frequency signal processing devices according to the first and second embodiments.

As described above, the characteristic configuration examples obtained from the present embodiment are summarized as follows:

(1) A high frequency signal processing device according to the present embodiment includes an oscillator circuit, a divider, an analog loop control circuit, a digital calibration circuit, a first modulation control circuit, a code selecting means, and a calibration controller. The oscillator circuit outputs a first oscillation signal of which the oscillation frequency is controlled according to an analog control signal and a first modulation code signal. The divider divides the first oscillation signal. When a first control signal is in an active state, the analog loop control circuit compares the phase of an output sent from the divider and the phase of a reference oscillation signal whose frequency is fixed in advance, generates the analog control signal according to the result of comparison and holds the value of the analog control signal when the first control signal is brought to an inactive state. When a second control signal is in an active state, the digital calibration circuit searches for the value of a first digital code signal in which a difference between the phase of the output of the divider and the phase of the reference oscillation signal becomes a minimum, while updating the value of the first digital code signal according to the result of comparison between the phase of the output of the divider and the phase of the reference oscillation signal. During the normal operation, the first modulation control circuit outputs a second digital code signal having the value of the first digital code signal searched by the digital calibration circuit, according to input transmission data during a normal operation. The code selecting means sets the value of the first modulation code signal to a predetermined initial value, the value of the first digital code signal or the value of the second digital code signal. During the normal operation, the calibration controller controls the code selecting means in such a manner that the value of the first modulation code signal is brought to the second digital code signal. During a calibration operation, the calibration controller performs the setting of a division ratio of the divider, control of the code selecting means, and control of activation/inactivation of the first and second control signals to thereby cause the digital calibration circuit to search for the value of the second digital code signal used during the normal operation.

(2) The high frequency signal processing device according to the present embodiment is configured in which in the configuration of (1) referred to above, the digital calibration circuit has a plurality of calibration sequences and is capable of selecting the calibration sequence to be executed from among them according to settings. Incidentally, the calibration sequences are respectively different from one another in terms of the contents of processing of combination of the setting of the division ratio of the divider, the control of the code selecting means, and the control of the activation/inactivation of the first and second control signals.

(3) The oscillator circuit according to the present embodiment includes a digital varactor capacitor which couples a capacitance value to an oscillation output node according to a first code signal to thereby set an oscillation frequency. The digital varactor capacitor includes first and second MIS transistors, and first and second buffer circuits. The first MIS transistor has a source and drain coupled in common. The second MIS transistor has a source and drain coupled in common and a gate coupled in common to a gate of the first MIS transistor. The second MIS transistor has a transistor size equal to n times that of the first MIS transistor. The first buffer circuit controls source and drain voltages of the first MIS transistor according to the first code signal. The second buffer circuit is configured to have an output capacity equal to n times that of the first buffer circuit and controls source and drain voltages of the second MIS transistor according to the first code signal.

(4) The oscillator circuit according to the present embodiment is configured in which in the configuration of (3) referred to above, first and second control lines that serve as the outputs of the first and second buffer circuits extend in a first direction, and a first wiring coupled in common to the gates of the first and second MIS transistors extends in a second direction orthogonal to the first direction.

(5) The oscillator circuit according to the present embodiment includes two differential output wirings that serve as differential oscillation output nodes, an inductor and a digital varactor capacitor coupled in parallel between the two differential output wirings, and transistor pairs each cross-coupled between the two differential output wirings. The digital varactor capacitor includes a plurality of capacitor pairs whose capacitance values are determined in advance. The capacitor pairs are selectively coupled to the two differential output wirings according to the input first code signal to thereby perform switching between the capacitance values. In such a configuration, the length of each wiring between the transistor pair and the digital varactor capacitor at the two differential output wirings is laid out to be longer than the length of each wiring between the transistor pair and the inductor.

While the invention made above by the present inventors has been described specifically on the basis of the preferred embodiments, the present invention is not limited to the embodiments referred to above, but may be modified in various ways within the scope not departing from the gist thereof.

Although the ZigBee (registered trademark) system has been explained by way of example herein, for example, the invention is of course not limited to it, but is widely applicable to general wireless communication systems that perform phase modulation (frequency modulation) using a PLL circuit. Although the digital calibration system has been applied as being targeted for the PLL circuit having the two-point modulation system as described in the first and second embodiments, it is not necessarily required to be the two-point modulation system, but may also be applied to a PLL circuit having one-point modulation system (only VCO modulation pass) in some cases. If, for example, a PLL circuit capable of setting a division ratio of a decimal point is used, then the above digital calibration system can be applied without significant area overhead, whereby an improvement in modulation accuracy and the like can be achieved.

What is claimed is:

1. A high frequency signal processing device, comprising:
an oscillator circuit which outputs a first oscillation signal of which the oscillation frequency is controlled according to an analog control signal and a first modulation code signal;
a divider which divides the first oscillation signal;
an analog loop control circuit which, when a first control signal is in an active state, compares the phase of an output from the divider and the phase of a reference oscillation signal, which is generated from a reference signal oscillator, whose frequency is fixed in advance, generates the analog control signal according to the result of comparison and holds the value of the analog control signal when the first control signal is brought to an inactive state;
a digital calibration circuit, which is electrically coupled to the reference signal oscillator which, when a second control signal is in an active state, searches for the value of a first digital code signal in which a difference between the phase of the output of the divider and the phase of the reference oscillation signal becomes a minimum, while updating the value of the first digital code signal according to the result of comparison between the phase of the output of the divider and the phase of the reference oscillation signal;
a first modulation control circuit which outputs a second digital code signal having the value of the first digital code signal searched by the digital calibration circuit, according to input transmission data during a normal operation;

a switch circuit, which is electrically coupled to the digital calibration circuit and the first modulation control circuit, which sets the value of the first modulation code signal to a predetermined initial value, the value of the first digital code signal or the value of the second digital code signal; and a calibration controller which, during the normal operation, controls the switch circuit in such a manner that the value of the first modulation code signal is brought to the second digital code signal, and which, during a calibration operation, performs the setting of a division ratio of the divider, control of the switch circuit, and control of activation/inactivation of the first and second control signals to thereby cause the digital calibration circuit to search for the value of the second digital code signal used during the normal operation.

2. The high frequency signal processing device according to claim 1, wherein the digital calibration circuit executes a first process for, during the calibration operation, setting the division ratio of the divider to a first value, controlling the switch circuit in such a manner that the value of the first modulation code signal is brought to the predetermined initial value, and waiting for convergence of the analog control signal after the first control signal has been controlled to the active state, and a second process for controlling the first control signal to the inactive state, setting the division ratio of the divider to a second value, controlling the switch circuit in such a manner that the value of the first modulation code signal is brought to the value of the first digital code signal, and controlling the second control signal to the active state.

3. The high frequency signal processing device according to claim 1, further comprising:

a second modulation control circuit which during the normal operation, outputs a second modulation code signal determined in advance to the divider according to the transmission data.

4. The high frequency signal processing device according to claim 1, wherein the oscillator circuit comprises:

an analog varactor capacitor which is coupled to oscillation output nodes each serving as an output node of the first oscillation signal and whose capacitance value varies according to the magnitude of the analog control signal; and a digital varactor capacitor which comprises a plurality of capacitive elements whose capacitance values are determined in advance, and selectively couples the capacitive elements to the oscillation output node according to the first modulation code signal to thereby perform switching between the capacitance values.

5. The high frequency signal processing device according to claim 4, wherein the digital calibration circuit comprises:

a digital phase frequency detector which compares the phase of the output of the divider and the phase of the reference oscillation signal and outputs digital values equal in value and different in sign to each other according to the result of comparison;

an accumulator which cumulatively adds the digital values outputted from the digital phase frequency detector;

a multiplier which multiplies the digital values thereof by predetermined times; and an adder which adds a result of addition by the accumulator and a result of multiplication by the multiplier, and wherein the value of the first digital code signal is updated following the result of addition by the adder.

6. The high frequency signal processing device according to claim 5, wherein the digital calibration circuit further comprises:

an average value calculation circuit which averages the result of addition by the accumulator with a predetermined period, and determines the result of search for the value of the first digital code signal by the result of calculation by the average value calculation circuit.

7. The high frequency signal processing device according to claim 4, wherein the digital varactor capacitor comprises:

a first MIS transistor having a source and drain coupled to each other;

a second MIS transistor having a source and drain coupled to each other and a gate coupled in common to a gate of the first MIS transistor, and having a transistor size equal to n times that of the first MIS transistor;

a first buffer circuit which controls source and drain voltages of the first MIS transistor according to the first modulation code signal; and a second buffer circuit which controls source and drain voltages of the second MIS transistor according to the first modulation code signal, and wherein the second buffer circuit comprises an output capacity equal to n times that of the first buffer circuit.

8. The high frequency signal processing device according to claim 7, wherein the digital varactor capacitor further comprises:

a capacitive element for sensitivity adjustment provided between each of the gates of the first and second MIS transistors and the oscillation output node.

9. A high frequency signal processing device, comprising:

an oscillator circuit which outputs a first oscillation signal of which the oscillation frequency is controlled according to an analog control signal and a first modulation code signal;

a divider which divides the first oscillation signal;

an analog loop control circuit which, when a first control signal is in an active state, compares the phase of an output from the divider and the phase of a reference oscillation signal, which is generated from a reference signal oscillator, whose frequency is fixed in advance, generates the analog control signal according to the result of comparison and holds the value of the analog control signal by a capacitive element of a loop filter when the first control signal is brought to an inactive state;

a digital calibration circuit electrically coupled to the reference signal oscillator which, when a second control signal is in an active state, searches for the value of a first digital code signal in which a difference between the phase of the output of the divider and the phase of the reference oscillation signal becomes a minimum, while updating the value of the first digital code signal according to the result of comparison between the phase of the output of the divider and the phase of the reference oscillation signal;

a first modulation control circuit which outputs a second digital code signal having the value of the first digital code signal searched by the digital calibration circuit, according to input transmission data during a normal operation;

a switch circuit, which is electrically coupled to the digital calibration circuit and the first modulation control circuit, which sets the value of the first modulation code signal to a predetermined initial value, the value of the first digital code signal or the value of the second digital code signal; and a calibration controller which, during the normal operation, controls the switch circuit in such a manner that the value of the first modulation code signal is brought to the second digital code signal, and which, during a calibration operation, performs a calibration sequence in which the setting of a division ratio of the divider, control of the switch circuit, and a procedure for control of activation/inactivation of the first and second control signals are appropriately combined together, and causes the digital calibration circuit to search for the value of the second digital code signal used during the normal operation, wherein the calibration controller further comprises a plurality of the calibration sequences and is capable of selecting the calibration sequence to be executed from within the calibration sequences, according to settings.

10. The high frequency signal processing device according to claim 9, wherein when a first calibration sequence is selected, the calibration controller performs a first A process for setting the division ratio of the divider to a first value, controlling the switch circuit in such a manner that the value of the first modulation code signal is brought to the predetermined initial value, and waiting for convergence of the analog control signal after the first control signal is controlled to the active state, and a second A process for controlling the first control signal to an inactive state, setting the division ratio of the divider to a second value, controlling the switch circuit in such a manner that the value of the first modulation code signal is brought to the value of the first digital code signal, and controlling the second control signal to the active state.

11. The high frequency signal processing device according to claim 10, wherein when a first A calibration sequence is selected, the calibration controller further executes, after the second A process in the first calibration sequence, a third A process for performing the same process as the first A process, and a fourth A process for performing a process similar to the second A process in a state in which the division ratio of the divider in the second A process has been changed to a third value.

12. The high frequency signal processing device according to claim 10, wherein when a first B calibration sequence is selected, the calibration controller further executes, after the second A process in the first calibration sequence, a third B process for performing a process similar to the second A process in a state in which the division ratio of the divider in the second A process has been changed to the third value.

13. The high frequency signal processing device according to claim 9, P1 wherein when a second calibration sequence is selected, the calibration controller executes a first C process for setting the division ratio of the divider to a first value, controlling the switch circuit in such a manner that the value of the first modulation code signal is brought to the predetermined initial value, and waiting for convergence of the analog control signal after the first control signal has been controlled to the active state, a second C process for controlling the first control signal to the inactive state, setting the division ratio of the divider to the first value, controlling the switch circuit in such a manner that the value of the first modulation code signal is brought to the value of the first digital code signal, controlling the second control signal to the active state and acquiring a result of search for the first digital code signal after the elapse of a first period, a third C process for performing the same process as the first C process, and a fourth C process for controlling the first control signal to the inactive state, setting the division ratio of the divider to a second value, controlling the switch circuit in such a manner that the value of the first modulation code signal is brought to the value of the first digital code signal, and controlling the second control signal to the active state, and wherein the result of search for the first digital code signal by the fourth C process is corrected using the result of search for the first digital code signal by the second C process to thereby determine the value of the second digital code signal used during the normal operation.

14. A high frequency signal processing device, comprising:

an oscillator circuit whose oscillation frequency is controlled according to an analog control signal and a first modulation code signal;

a divider which divides the output of the oscillator circuit;

an analog loop control circuit which compares the phase of an output from the divider and the phase of a reference oscillation signal, which is generated from a reference signal oscillator, whose frequency is fixed in advance, and generates the analog control signal according to the result of comparison;

a digital calibration circuit electrically coupled to the reference signal oscillator; and a calibration controller, wherein the first modulation code signal is a code signal for determining an amount of change in frequency for frequency modulation performed in the oscillator circuit, wherein the digital calibration circuit compares the phase of the output of the divider and the phase of the reference oscillation signal, and searches for the optimal value of the first modulation code signal according to a result of comparison, and wherein the calibration controller sets a first division ratio to the divider and causes the analog loop control circuit to determine the value of the analog control signal, and then causes the analog loop control circuit to hold the value of the analog control signal, sets a second division ratio at which the amount of change in the frequency is reflected onto the first division ratio, to the divider, and causes the digital calibration circuit to search for the optimal value of the first modulation code signal wherein the digital calibration circuit comprises:

a digital phase frequency detector which compares the phase of the output of the divider and the phase of the reference oscillation signal and outputs digital values equal in value and different in sign to each other according to the result of comparison;

an accumulator which cumulatively adds the digital values outputted from the digital phase frequency detector;

a multiplier which multiplies the digital values thereof by a predetermined value; and an adder which adds a result of addition by the accumulator and a result of multiplication by the multiplier, and wherein upon searching for the optimal value of the first modulation code signal, the value of the first modulation code signal is updated following the result of addition by the adder.

15. The high frequency signal processing device according to claim 14, further comprising:
  a first modulation control circuit which outputs the optimal value of the first modulation code signal searched by the digital calibration circuit to the oscillator circuit according to input transmission data; and
  a second modulation control circuit which outputs a second modulation code signal determined in advance to the divider according to the transmission data.

16. The high frequency signal processing device according to claim 14,
  wherein the digital calibration circuit further comprises an average value calculation circuit which averages the result of the addition by the accumulator with a predetermined period, and determines the optimal value of the first modulation code signal by the result of calculation by the average value calculation circuit.

* * * * *